US012564007B2

(12) United States Patent
Ito et al.

(10) Patent No.: US 12,564,007 B2
(45) Date of Patent: Feb. 24, 2026

(54) TAPE STICKING SYSTEM, TAPE STICKING METHOD, TAPE PEELING SYSTEM, AND TAPE PEELING METHOD

(71) Applicants: EBARA CORPORATION, Tokyo (JP); IS ENGINEERING CO., LTD., Niigata (JP)

(72) Inventors: Kenya Ito, Tokyo (JP); Takumi Yamada, Tokyo (JP); Mahito Shibuya, Niigata (JP); Daisuke Nagumo, Niigata (JP)

(73) Assignees: EBARA CORPORATION, Tokyo (JP); IS ENGINEERING CO., LTD., Niigata (JP)

( * ) Notice: Subject to any disclaimer, the term of this patent is extended or adjusted under 35 U.S.C. 154(b) by 476 days.

(21) Appl. No.: 18/018,850

(22) PCT Filed: Aug. 4, 2021

(86) PCT No.: PCT/JP2021/028979
§ 371 (c)(1),
(2) Date: Jan. 30, 2023

(87) PCT Pub. No.: WO2022/030556
PCT Pub. Date: Feb. 10, 2022

(65) Prior Publication Data
US 2023/0317501 A1    Oct. 5, 2023

(30) Foreign Application Priority Data
Aug. 7, 2020   (JP) ................................. 2020-135187

(51) Int. Cl.
    *B32B 41/00*     (2006.01)
    *H01L 21/67*     (2006.01)
    *H01L 21/683*     (2006.01)

(52) U.S. Cl.
    CPC .... *H01L 21/6836* (2013.01); *H01L 21/67092* (2013.01); *H01L 21/67132* (2013.01); *H01L 2221/6834* (2013.01)

(58) Field of Classification Search
    CPC ........... H01L 21/6836; H01L 21/67092; H01L 21/67132; H01L 2221/6834;
       (Continued)

(56) References Cited

U.S. PATENT DOCUMENTS

2016/0023861 A1   1/2016   Ito et al.
2018/0076043 A1*   3/2018   Ito ...................... B23K 26/0823

FOREIGN PATENT DOCUMENTS

JP     2008-166459 A    7/2008
JP     2009-094355 A    4/2009
       (Continued)

OTHER PUBLICATIONS

European Patent Application No. 21853980.7; Partial Search Report; dated Oct. 9, 2024; 14 pages.
       (Continued)

*Primary Examiner* — Michael N Orlando
*Assistant Examiner* — Joshel Rivera
(74) *Attorney, Agent, or Firm* — BakerHostetler

(57) ABSTRACT

The present invention relates to a tape sticking system for sticking a protective tape for protecting a peripheral portion of a substrate, such as a wafer. The tape sticking apparatus (10) includes a substrate holder (21) for sticking, a side roller (43), a first roller (46), a second roller (47), a roller-driving motor (49) coupled to the second roller (47), and a nipping mechanism (60) for nipping the peripheral portion of the substrate (W) with the first roller (46) and the second roller (47). The tape sticking apparatus (10) is configured to cause the second roller (47) to be rotated by use of the roller-driving motor (49) while nipping the peripheral por-
       (Continued)

tion of the substrate, held to the substrate holder (21) for sticking, with the first roller (46) and the second roller (47), to thereby rotate the substrate.

20 Claims, 34 Drawing Sheets

(58) Field of Classification Search
CPC ......... H01L 21/67115; H01L 21/67207; H01L 21/68; H01L 21/6838; H01L 21/68707; H01L 21/67742; H01L 2221/68318; H01L 2221/68381
USPC .................... 156/60, 64, 350, 351, 378, 379
See application file for complete search history.

(56) References Cited

FOREIGN PATENT DOCUMENTS

| JP | 2011-077150 A | 4/2011 |
| JP | 2011-108978 A | 6/2011 |
| JP | 2012-069782 A | 4/2012 |
| JP | 2013-219069 A | 10/2013 |
| JP | 2013-230532 A | 11/2013 |
| JP | 2015-224300 A | 12/2015 |
| JP | 2016-082054 A | 5/2016 |
| JP | 2016-152317 A | 8/2016 |
| JP | 2018-043340 A | 3/2018 |
| JP | 2019-021847 A | 2/2019 |

OTHER PUBLICATIONS

International Patent Application No. PCT/JP2021/028979; Int'l Search Report; dated Oct. 12, 2021; 3 pages.

* cited by examiner

DIRECTION OF MOVEMENT OF
PROTECTIVE TAPE AND WAFER

FIG. 23

TAPE STICKING SYSTEM, TAPE STICKING METHOD, TAPE PEELING SYSTEM, AND TAPE PEELING METHOD

CROSS-REFERENCE TO RELATED APPLICATIONS

This application is a U.S. national phase application of International Patent Application No. PCT/JP2021/028979 filed Aug. 4, 2021, which claims the benefit of Japanese Patent Application No. 2020-135187 filed Aug. 7, 2020, which are incorporated by reference in their entireties for any and all purposes.

TECHNICAL FIELD

The present invention relates to a tape sticking system and a tape sticking method of sticking a protective tape that protects a peripheral portion of a substrate, such as a wafer. The present invention also relates to a tape peeling system and a tape peeling method of peeling a protective tape stuck on a peripheral portion of a substrate, such as a wafer.

BACKGROUND ART

In conventional practice, a protective film is attached to an entirety of a front surface of a wafer in order to protect devices formed on the front surface of the wafer. Further, a protective film may be attached to an entirety of a back surface (i.e., a surface opposite to the front surface on which devices are formed) in order to protect the back surface from a liquid chemical (e.g., a plating solution) and metal contaminations. In a plating process, for example, a wafer, having a protective film attached to the back surface thereof, is immersed in a plating solution, and plating of the wafer is performed in this state.

However, during processing of the wafer, the protective film may be lifted up due to peeling off the back surface protective film from the peripheral portion thereof. For example, since the plating solution is heated to a certain processing temperature, the adhesive power of adhesive of the protective film is lowered, and as a result, the peripheral portion of the protective film may be peeled off the wafer to thereby lift up the protective film. Once the peripheral portion of the protective film has been peeled off, the plating solution intrudes into a gap between the back surface of the wafer and the protective film. As a result, metal ions contained in the plating solution may adhere to the back surface of the wafer composed of silicon, and may diffuse into the wafer, resulting in performance failure of devices. Therefore, recently, there is a demand for protecting not only the front surface and the back surface of the wafer but also the peripheral portion of the wafer with the protective tape or the like.

For example, in a plating process for so-called TAIKO (registered trademark) wafers, in which only a center portion of back surface of the wafer is polished (ground) to make it thinner, a protective film is attached to the back surface of the wafer to thereby prevent plating solution (in which a cleaning liquid is included) from coming around the back surface of the wafer. However, an edge shape of TAIKO wafer causes the protective film to easily peel off or be lifted up from the periphery portion, resulting in a decrease in yield due to the penetration of plating solution into the back surface of the wafer. In order to prevent this penetration of plating solution and to ensure a stable process, it was necessary to cover the peripheral portion of the wafer (including a bevel portion and top and bottom surfaces of the edge portion of approximate 3 mm) with the protective tape (having a tape width of approximate 6 mm).

After completion of various processes, such as plating or dry etching, of the wafer to which the protective tape is attached, the protective tape is peeled off the wafer.

CITATION LIST

Patent Literature

Patent document 1: Japanese Patent No. 6340249

SUMMARY OF INVENTION

Technical Problem

The demand from the automotive industry, which is progressively shifting to electrification worldwide, has led to a noticeable demand for a shift to larger-diameter wafers. The process of sticking the protective tape on the peripheral portion of the wafer and the apparatus for sticking the protective tape are also faced with an issue to handle the larger diameter wafer (e.g., having a diameter of 300 mm), and thus there is a growing demand to stick the protective tape on the wafer without damaging the wafer, even when the diameter of wafer becomes larger.

Further, in recent years, from the viewpoint of improving throughput and yield, there is a growing demand to shorten a time required to peel off the protective tape and to prevent a part of adhesive of the protective tape from remaining on the wafer (adhesive residue) after the protective tape has been peeled off.

The present invention has been made in view of the above drawbacks. It is an object to provide a tape sticking system and a tape sticking method capable of sticking a protective tape for protecting a peripheral portion of a substrate, such as a wafer, on the peripheral portion of the substrate while preventing damage to the substrate.

A further object is to provide a tape peeling system and a tape peeling method capable of shortening a time required for peeling the protective tape and preventing adhesive residue of the protective tape.

Solution to Problem

In one embodiment, there is provided a tape sticking system, comprising: a tape sticking apparatus configured to stick a protective tape on a peripheral portion of a substrate, wherein the tape sticking apparatus includes: a substrate holder for sticking configured to rotatably hold the substrate; a side roller configured to press the protective tape against a peripheral side surface of the substrate; a first roller configured to bend the protective tape along a longitudinal direction thereof, and stick a bent portion of the protective tape onto a first surface of the peripheral portion of the substrate; a second roller configured to bend the protective tape along a longitudinal direction thereof, and stick a bent portion of the protective tape onto a second surface of the peripheral portion of the substrate; a roller-driving motor coupled to the second roller, and a nipping mechanism configured to cause the first roller and the second roller to nip the peripheral portion of the substrate, and wherein the tape sticking apparatus is configured to cause the second roller to be rotated by use of the roller-driving motor while nipping the peripheral portion of the substrate, held to the substrate holder for sticking, with the first roller and the second roller, to thereby rotate the substrate.

In one embodiment, the second roller is arranged below the first roller.

In one embodiment, the first roller and the second roller have a tapered shape with a gradually decreasing cross-sectional area toward a tip, respectively, and the first roller and the second roller are arranged so that the tips are inclined toward a surface of the substrate.

In one embodiment, the first roller and the second roller are made of rubber.

In one embodiment, the tape sticking apparatus further comprises a tape heating apparatus configured to heat the protective tape stuck on the peripheral portion of the substrate.

In one embodiment, the tape sticking system further comprises a transfer robot configured to transfer the substrate to the tape sticking apparatus, wherein the transfer robot includes a Bernoulli hand configured to hold the substrate using Bernoulli's theorem.

In one embodiment, the tape sticking apparatus comprises a plurality of tape sticking apparatus, and the plurality of tape sticking apparatus are arranged side by side in a vertical direction or in a horizontal direction.

In one embodiment, the tape sticking system further comprises a tape peeling apparatus configured to peel the protective tape from the peripheral portion of the substrate, wherein the tape peeling apparatus includes; a substrate holder for peeling configure to hold and rotate the substrate, and a UV irradiation module configured to irradiate ultraviolet rays to the protective tape stuck on the peripheral portion of the substrate.

In one embodiment, the tape peeling apparatus is arranged below the tape sticking apparatus.

In one embodiment, the tape peeling apparatus comprises a plurality of tape peeling apparatuses, and the plurality of tape peeling apparatuses are arranged side by side horizontally.

In one embodiment, there is provided a tape sticking method of sticking a protective tape on a peripheral portion of a substrate, comprising: holding the substrate rotatably by use of a substrate holder for sticking; pressing the protective tape against a peripheral side surface of the substrate; causing a second roller to be rotated by use of a roller-driving motor coupled to a second motor while nipping the peripheral portion of the substrate with a first roller and the second roller, to thereby rotate the substrate; bending the protective tape along a longitudinal direction thereof by use of the first roller, and then sticking a bent portion of the protective tape onto a first surface of the peripheral portion of the substrate; and bending the protective tape along the longitudinal direction thereof, and then sticking a bent portion of the protective tape onto a second surface of the peripheral portion of the substrate.

In one embodiment, the tape sticking method further comprises heating the protective tape stuck on the peripheral portion of the substrate.

In one embodiment, the tape sticking method further comprises: irradiating ultraviolet rays to the protective tape stuck on the peripheral portion; and peeling the protective tape from the peripheral portion of the substrate while rotating the substrate.

In one embodiment, there is provided a tape peeling system, comprising: a tape peeling apparatus configured to peel a protective tape from a peripheral portion of a substrate, wherein the tape peeling apparatus includes: a substrate holder for peeling configured to hold and rotate the substrate; a tape peeling unit configured to peel the protective tape from the rotating substrate; and a UV irradiation module configured to irradiate ultraviolet rays to the protective tape stuck on the peripheral portion of the substrate.

In one embodiment, the UV irradiation module further comprises: a UV irradiation unit configured to irradiate ultraviolet rays a substrate holder for UV irradiation configured to hold the substrate; and a cup-shaped light-shielding cover coupled to the UV irradiation unit, and the light-shielding cover is formed to be able to cover the substrate in its entirety.

In one embodiment, the substrate holder for UV irradiation includes: a substrate holding device configure to hold and rotate the substrate; and an elevating mechanism configured to move the substrate holding device up and down, and the light-shielding cover is disposed above the substrate holding device, In one embodiment, the tape peeling system further comprises a transfer robot configured to transfer the substrate to the tape peeling apparatus, wherein the transfer robot includes a Bernoulli hand configured to hold the substrate using Bernoulli's theorem.

In one embodiment, there is provided a tape peeling method of peeling off a protective tape from a peripheral portion of a substrate, comprising: irradiating ultraviolet rays to the protective tape stuck on the peripheral portion; and peeling the protective tape from the peripheral portion of the substrate while rotating the substrate.

In one embodiment, irradiating ultraviolet rays to the protective tape stuck on the peripheral portion comprises irradiating ultraviolet rays to the protective tape stuck on the peripheral portion while covering the substrate in its entirety with the light-shielding cover.

In one embodiment, irradiating ultraviolet rays to the protective tape stuck on the peripheral portion while covering the substrate in its entirety with the light-shielding cover includes irradiating ultraviolet rays to the protective tape while rotating the substrate.

Advantageous Effects of Invention

According to the present invention, a force to rotate the substrate is applied to the peripheral portion of the substrate, so that a distance in a radial direction of the substrate between a place where the force in the direction of rotation of the substrate is applied and a place where the protective tape is pressed can be decreased. Therefore, a load applied to the substrate can be reduced, thereby preventing the substrate to be damaged.

Further, according to the present invention, irradiating ultraviolet rays to the protective tape with UV curable adhesive layer causes the adhesive layer to be cured, thereby making the protective tape easier to be peeled off. As a result, it is possible to reduce a time required to peel off the protective tape, and to prevent adhesive residue.

BRIEF DESCRIPTION OF DRAWINGS

FIG. 23 is a schematic view showing a centering mechanism;

DESCRIPTION OF EMBODIMENTS

Embodiments of the tape sticking system and tape peeling system will be described below with reference to the drawings.

A tape sticking system serves as a system for sticking a protective tape on a peripheral portion of a substrate, such as a wafer, and thus protecting the peripheral portion of the substrate with the protective tape. A tape peeling system serves as a system for peeling off a protective tape stuck on a peripheral portion of a substrate, such as a wafer. Examples of the protective tape may include a masking tape. In this specification, the peripheral portion of the substrate is defined as an area that includes a bevel portion, located outermost in the substrate, and a top edge portion and a bottom edge portion, lying radially inside the bevel portion.

Figure 1A:
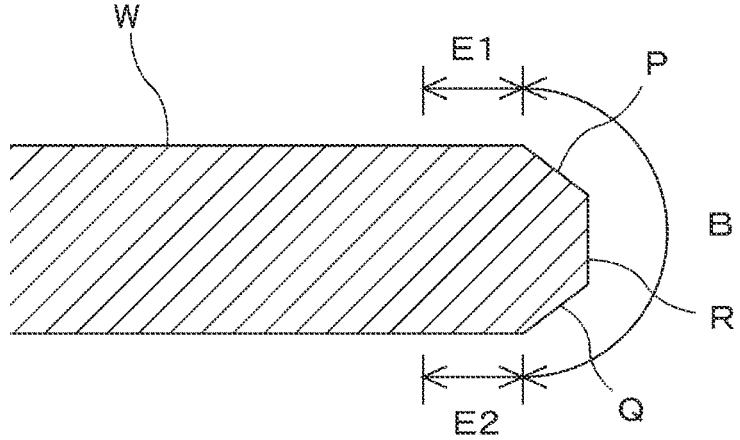
FIG. 1A is an enlarged cross-sectional view showing a peripheral portion of a wafer.
Figure 1B:
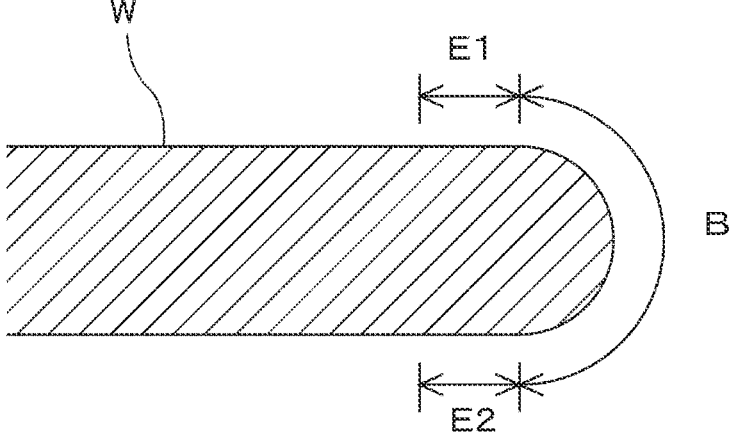
FIG. 1B is an enlarged cross-sectional view showing a peripheral portion of a wafer.

FIGS. 1A and 1B are enlarged cross-sectional views each showing a peripheral portion of a wafer which is an example of the substrate. More specifically, FIG. 1A is a cross sectional view of a wafer of a so-called straight type, and FIG. 1B is a cross sectional view of a wafer of a so-called round type. In the wafer W shown in FIG. 1A, a bevel portion is an outermost circumferential portion (indicated by symbol B) including an upper slope (or an upper bevel portion) P, a lower slope (or a lower bevel portion) Q, and a side portion (or an apex) R of the wafer W. In the wafer W shown in FIG. 1B, the bevel portion is an outermost portion (indicated by a symbol B) having a curved cross-section. The top edge portion is a flat portion E1 lying radially inside the bevel portion B. The bottom edge portion is a flat portion E2 located opposite to the top edge portion and lying radially inside the bevel portion B.

The bevel portion B, the top edge portion E1, and the bottom edge portion E2 are collectively referred to as a peripheral portion. The peripheral portion may include an area where devices are formed. In the following descriptions, a peripheral side surface of the peripheral portion in the wafer W refers to a surface of the bevel portion B, a top surface of the peripheral portion in the wafer W refers to a surface of the top edge portion E1, and a bottom surface of the peripheral portion in the wafer W refers to a surface of the bottom edge portion E2.

Figure 2:
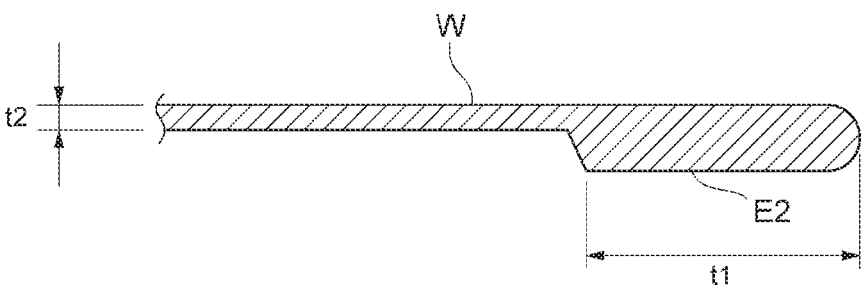
FIG. 2 is an enlarged cross-sectional view showing an embodiment of the wafer.

FIG. 2 is an enlarged cross-sectional view showing an embodiment of the wafer W. The wafer W shown in FIG. 2 is a so-called TAIKO (registered trademark) wafer, in which a center portion of a back surface of the wafer W (an area lying inside the wafer W in a radial direction from the bottom edge portion E2) is thinner than the peripheral portion. In one embodiment, a length t1 of the bottom edge portion E2 in a radial direction is within a range of 3 mm to 5 mm, and a thickness t2 of the center portion is 50 μm. Although, in this embodiment, TAIKO wafer is used as the wafer W, the wafer W may be illustrated in the drawings as a wafer whose center portion is not ground in order to make the drawings easier to see. The wafer W is not limited to TAIKO wafer, can use any wafer other than TAIKO wafer (e.g., a general wafer whose center is not ground as described above).

Figure 3:
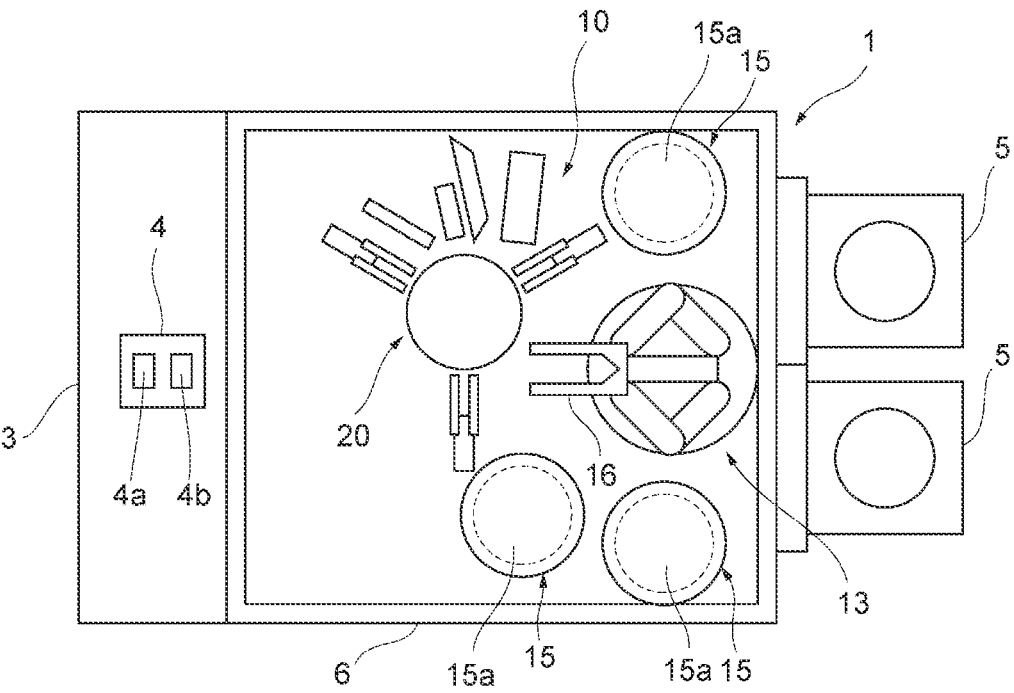
FIG. 3 is a plan view schematically showing an embodiment of a tape sticking system.
Figure 4:
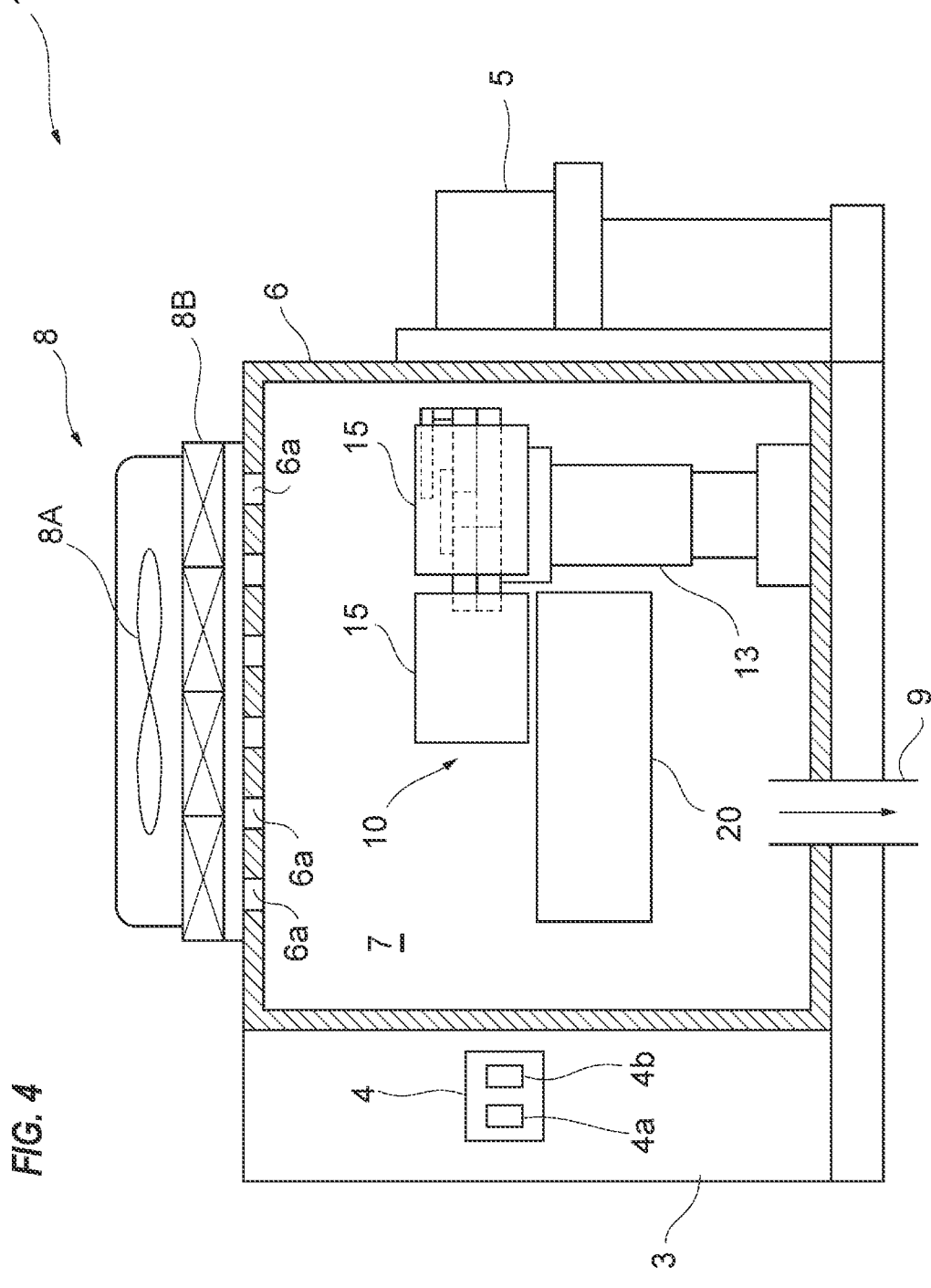
FIG. 4 is a side view schematically showing the tape sticking system shown in FIG. 3.

FIG. 3 is a plan view schematically showing an embodiment of a tape sticking system, and FIG. 4 is a side view schematically showing the tape sticking system of FIG. 3. The tape sticking system 1 includes a tape sticking apparatus 10 for sticking a protective tape on a peripheral portion of a wafer W, which is an example of a substrate, a transfer robot 13 for transferring the wafer W to the tape sticking apparatus 10, a plurality of load ports 5 for receiving thereon wafer cassettes (substrate cassettes) each storing a number of wafers therein, and a power controller 3.

The power controller 3 includes a power supply (not shown), and an operation controller 4 for controlling operations of the tape sticking apparatus 10 and the transfer robot 13. The tape sticking apparatus 10 and the transfer robot 13 are electrically connected to the operation controller 4. The operation controller 4 is configured to command to each component of the tape sticking apparatus 10 and the transfer robot 13 to thereby control operations of each component of the tape sticking apparatus 10 and the transfer robot 13.

The operation controller 4 is constituted by at least one computer. The operation controller 4 includes a memory 4a storing programs therein, and an arithmetic device 4b configured to perform arithmetic operations according to instructions contained in the programs. The memory 4a includes a main memory, such as a RAM, and an auxiliary memory, such as a hard disk drive (HDD) or a solid state drive (SSD). Examples of the arithmetic device 10b include a CPU (central processing unit) and a GPU (graphic processing unit). However, the specific configuration of the operation controller 4 is not limited to these examples.

The load port 5 can be mounted with an open cassette, a SMIF (Standard Manufacturing Interface) pod, or a FOUP (Front Opening Unified Pod). Each of the SMIF and the FOUP is an airtight container which houses a substrate cassette therein and which, by covering it with a partition wall, can keep its internal environment isolated from an external environment. The transfer robot 13 is configured to transfer the wafer W between the load port 5 and the tape sticking apparatus 10. Further, the transfer robot 13 is configured to transfer the wafer W between the tape sticking apparatus 20 and tape heating apparatuses 15, which will be described later.

As shown in FIG. 4, the tape sticking apparatus includes a partition wall 6 and a ventilating device 8. An inside space of the partition wall 6 provides a processing chamber 7. The tape sticking apparatus 10 and the transfer robot 13 are disposed in the processing chamber 7. The partition wall 6 has a door (not shown), so that the wafer W can be carried into the processing chamber 7 through the door, and can be carried out from the processing chamber 7 through the door.

Clean-air intakes 6a are formed in an upper portion of the partition wall 6, and a local exhaust ventilation 9 for sucking and exhausting dusts, particles, or the like in the space, is formed below the tape sticking apparatus 10 (i.e., in a lower portion of the partition wall 6). The ventilating device 8 is provided on an upper surface of the partition wall 6. The ventilating device 8 includes a fan 8A, and a filter 8B for removing particles and dusts contained in an air sent from the fan 8A. The ventilating device 8 is configured to send a clean air into the processing chamber 7 through the clean-air intakes 6a, and discharge a gas in the processing chamber 7 from the local exhaust ventilation 9. Therefore, the clean air forms a down flow in the processing chamber 7. As a result, contamination of the surface of wafer W due to fluttering particles and adhesion of dusts to the peripheral portion of the wafer W can be prevented.

The tape sticking apparatus 10 includes a tape sticking module 20 for rotating the wafer W and sticking the protective tape on the peripheral portion of the wafer W, and the plurality of tape heating apparatuses 15 for heating the protective tape that has been stuck on the peripheral portion of the wafer W.

Figure 5:
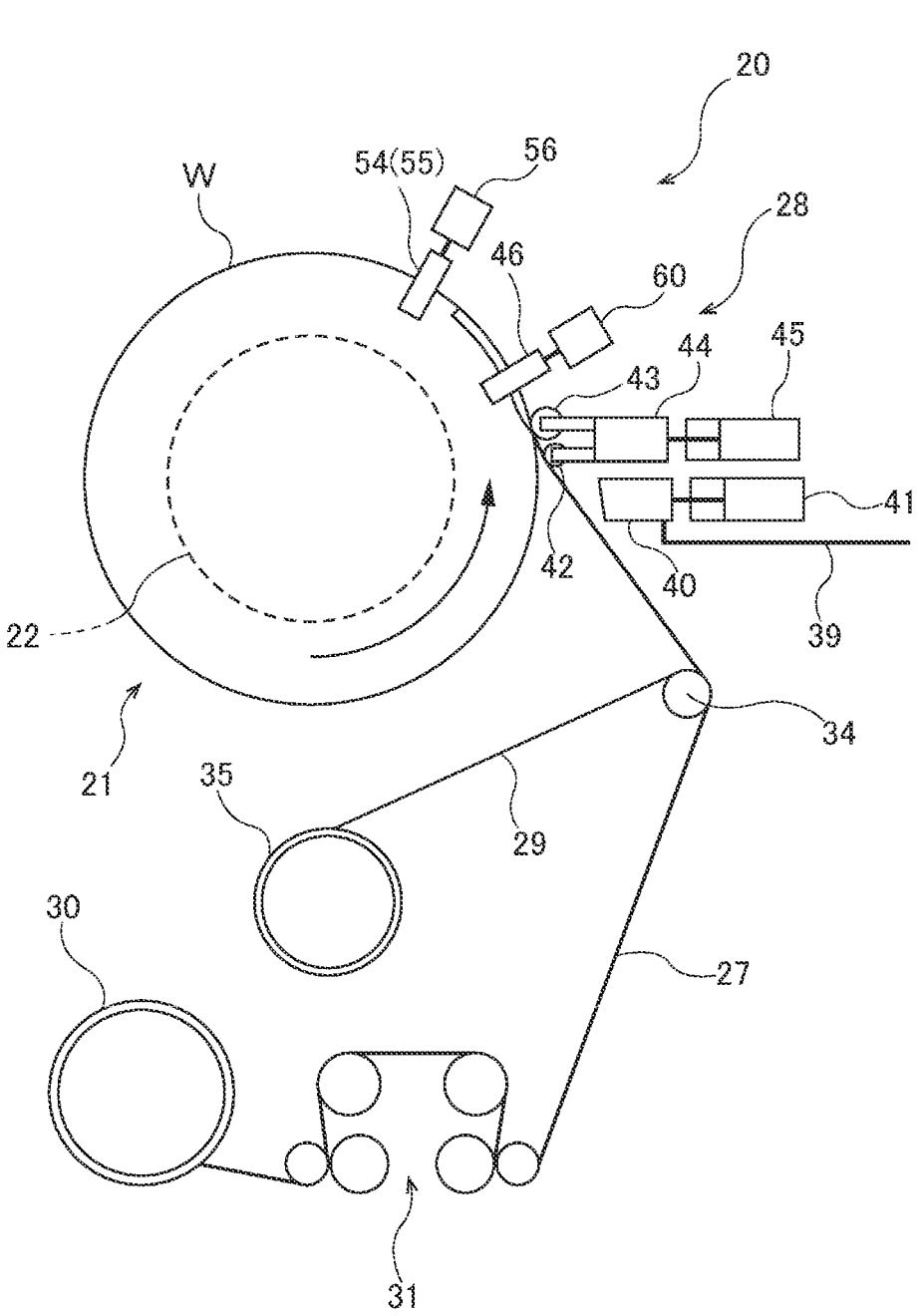
FIG. 5 is a schematic view showing a tape sticking module.

FIG. 5 is a schematic view showing the tape sticking module 20. The tape sticking module 20 includes a substrate holder 21 for sticking that holds the wafer W in a rotatable manner, and a tape sticking unit 28 that sticks the protective tape on the peripheral portion of the wafer W while rotating the wafer W. As shown in FIG. 5, the tape sticking unit 28 is configured to stick the protective tape 27 on the peripheral portion of the wafer W, while rotating the wafer held by a substrate stage 22 (illustrated in FIGS. 6A and 6B) in a direction indicated by arrow in the figure. In this embodiment, a protective film 38 (illustrated in FIG. 10) is attached to a back surface (i.e., lower surface) of the wafer W, and the protective tape 27 is stuck on the peripheral portion of the wafer W so as to cover an outer peripheral edge of the protective film 38 attached to the lower surface of the wafer W and the peripheral portion of the wafer W in its entirety. The outer peripheral edge of the protective film 38 constitutes at least a part of the lower surface of the peripheral portion of the wafer W. In this embodiment, the protective film 38 is included in the wafer W.

Figure 6A:
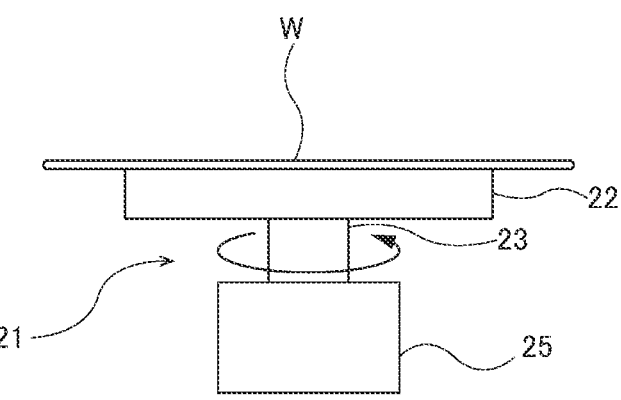
FIG. 6A is a side view of a substrate holder for sticking.
Figure 6B:
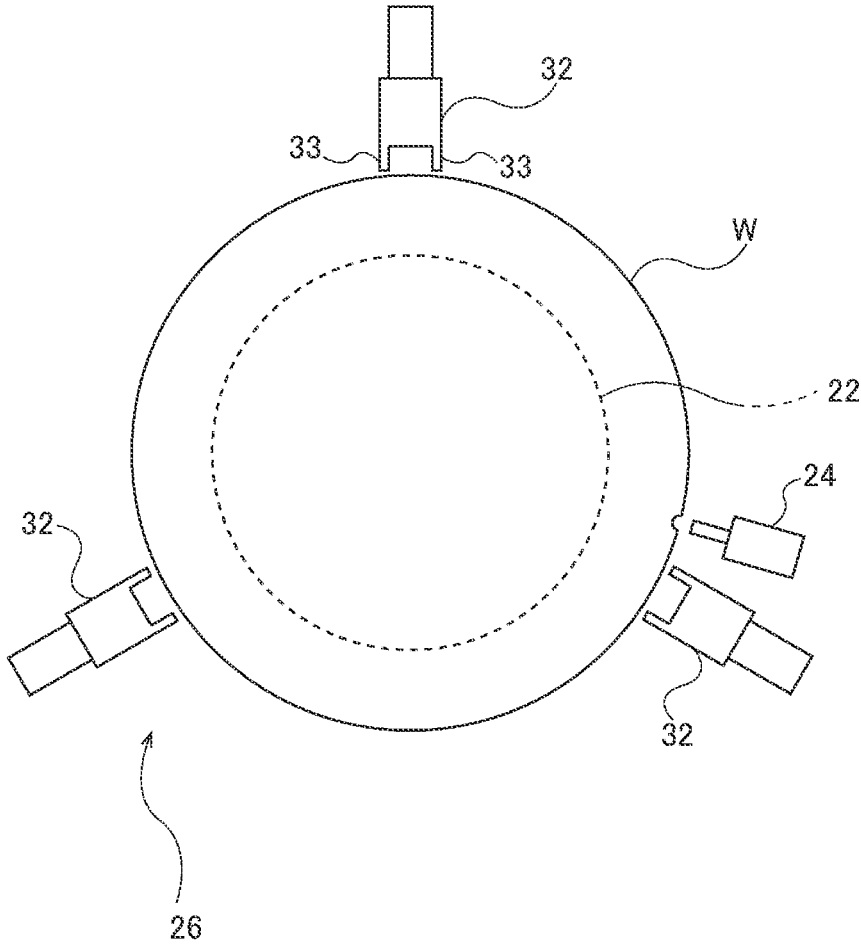
FIG. 6B is a plan view of the substrate holder for sticking.

FIGS. 6A and 6B are views each showing a substrate holder 21 for sticking. More specifically, FIG. 6A is a side view of the substrate holder 21 for sticking, and FIG. 6B is a plan view of the substrate holder 21 for sticking. As shown in FIG. 6A, the substrate holder 21 for sticking includes a substrate stage 22 for holding the wafer W horizontally, a shaft 23 secured to a center of a lower surface of the substrate stage 22, and a shaft support 25 for rotatably supporting the shaft 23. The substrate stage 22 is coupled to a vacuum source, which is not shown in the drawings, so that the wafer W can be held to an upper surface of the substrate stage 22 (i.e., substrate holding surface) by vacuum suction force generated by the vacuum source. This operation can prevent the wafer W from shifting or lifting.

The shaft 23 is configured to rotate about an axis thereof together with the substrate stage 22 by applying a force in its circumferential direction to the substrate stage 22. Specifically, when the force in the rotational direction (e.g., in the direction indicated by arrow in FIG. 5) is applied to the wafer W in a state where the wafer W is held by the substrate stage 22, the shaft 23 rotates about its axis together with the substrate stage 22 and the wafer W. In this embodiment, the shaft support 25 is a motor, which has a rotational shaft (not shown). The shaft 23 is coupled to the rotational shaft of the shaft support 25. The rotational shaft of the shaft support 25 is configured to be able to rotate when the force in the rotational direction is applied from the outside in a state the shaft support 25 is not in operation.

When the shaft support 25 is set in motion, the shaft 23 rotates around its axis, and the substrate stage 22 and the wafer W placed on the substrate stage 22 rotate in accordance with the rotation of the shaft 23. However, during the sticking process, operation of the shaft support 25 is stopped. The shaft support 25 is not limited to this embodiment. In one embodiment, the shaft support 25 may has a bearing to rotatably support the shaft 23, instead of the motor.

As shown in FIG. 6B, the substrate holder 21 for sticking further includes a centering mechanism 26 for centering the wafer W before holding the wafer W to the substrate stage 22 by the vacuum suction. The centering mechanism 26 includes a plurality of (e.g., three as illustrated) centering fingers 32 arranged at equal intervals along a circumferential direction of the wafer W. Each centering finger 32 has, at its front end, two projecting portions (finger portions) 33 capable of touching the peripheral portion of the wafer W. Each centering finger 32 is configured to be capable of moving toward the center of the wafer W and away from the wafer W by a moving device (e.g., air cylinder), which is not illustrated in the drawings. When each centering finger 12 moves toward the center of the wafer W, the projecting portions 33 come into contact with the peripheral portion of the wafer W, thereby pressing the wafer W toward its center. The three centering fingers 32 are simultaneously moved toward the center of the wafer W, so that the peripheral portion of the wafer W is pressed from three directions simultaneously toward the center of the wafer W. The centering of the wafer W is performed in this manner. Upon completion of the centering of the wafer W, the center of the rotating shaft 23 is aligned with the center of the wafer W.

Further, the substrate holder 21 for sticking includes a notch detector 24 which can detect a notch of the wafer W. By using the notch detector 24 to detect the notch on the wafer W, a reference for a rotational position of the wafer W becomes clear, and thus positions where the protective tape starts and ends to be stuck on the wafer can be determined at desired positions. The shaft support 25 rotates the shaft 23 to detect the notch on the wafer W.

Returning to FIG. 5, the protective tape 27 to be supplied to the tape sticking unit 28 is held on a feeding roller 30. The protective tape 27, fed from the feeding roller 30, passes through a tension unit 31 having a plurality of rollers, where a desired tension is applied to the protective tape 27. In other words, the protective tape 27 is stuck on the peripheral portion of the wafer W with the desired tension applied. The protective tape 27 that has passed through the tension unit 31 is supplied through a guide roller 14 to the tape sticking unit 28. A separation film 29, which is attached to an adhesive surface of the protective tape 27, is peeled off from the protective tape 27 when the protective tape 27 passes the guide roller 34, and is wound around a film take-up roller 35.

The protective tape 27 comprises a flexible base tape, and an adhesive layer formed to one surface of the base tape. A synthetic resin, such as polyolefin (PO), polyethylene (PE), or polyimide, can be used as a material of the base tape. The adhesive layer has an adhesive. A thickness of the protective tape 27 is, for example, within a range of 60 μm to 80 μm. In one embodiment, as the adhesive in the adhesive layer, a UV-curable adhesive can be used. Hereinafter, the adhesive layer having the UV-curable adhesive may be referred to as a UV-curable adhesive layer.

Further, in one embodiment, the protective tape 27 may be a type of tape without the separation film 29 attached. Eliminating of the separation film 29 enables the thickness of the protective tape 27 to be reduced, and thus the radius of the feeding roller 30 can be reduced. Further, the film take-up roller 35 is unnecessary, resulting in simplifying the tape sticking apparatus 10 and reducing cost of the tape sticking system 1 in its entirety. Examples of the type of tape without the separation film 29 attached include a tape with a thermosetting adhesive layer. Further, in one embodiment, in order to make the tape sticking apparatus 10 common regardless of the presence or absence of the separation film 29, the tape sticking module 20 may have a sensor for detecting the presence or absence of the separation film 29.

Figure 7A:
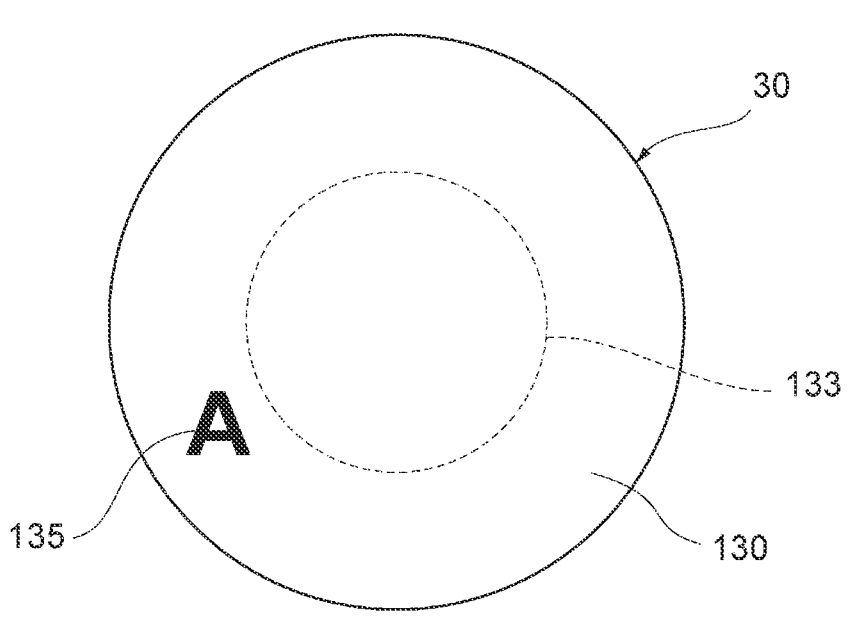
FIG. 7A is a schematic view showing another embodiment of a feeding roller.
Figure 7B:
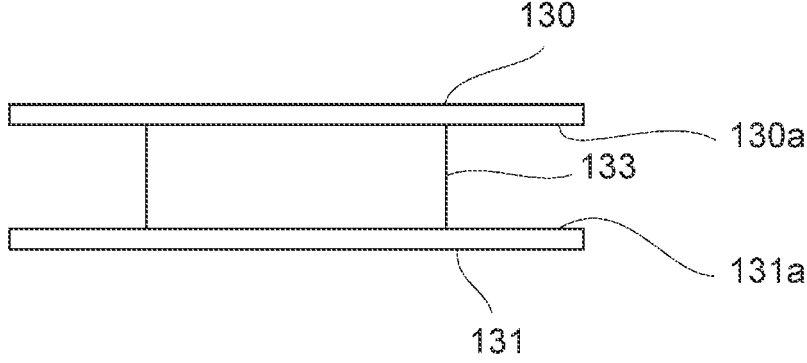
FIG. 7B is a schematic view showing another embodiment of the feeding roller.

FIGS. 7A and 7B are schematic views each showing the feeding roller 30 according to another embodiment. The feeding roller 30 shown in FIGS. 7a and 7b has a core 133 around which the protective tape 27 is wound, and support surfaces 130, 131 provided at both ends of the core 133. Radii of the support surfaces 130, 131 are larger than a radius of the core 133. The support surfaces 130, 131 have flanges 130a, 131a, respectively. As wafers become larger in diameter (e.g., 300 mm diameter wafers), a length of the protective film 27 held by the feeding roller 30 may become longer. In such cases, the protective tape 27 may be wrapped around the feeding roller 30 due to a deviation in a width direction of the protective tape 27. In this embodiment, the flanges 130a, 131a can prevent the above mentioned deviation.

Further, in one embodiment, as shown in FIGS. 7A and 7B, the support surfaces 130, 131 may have markings, which represent each of the support surfaces, on their surfaces. Specifically, the support surface 130 is marked with a mark 135 representing the support surface 130, and the support surface 131 is marked with a mark having a different shape from the mark 135. In the example shown in FIGS. 7a and 7b, the support surface 130 is marked with a letter A, and the support surface is marked with a letter B (not shown). These marks make the front and back surfaces of the feeding roller 30 clear, and thus can prevent the feeding roller 30 from being set up in the incorrect orientation.

Further, in one embodiment, the feeding roller 30 may have an identification device embedded therein, such as an IC chip, with identification information which includes, for example, lot number, date of manufacture, expiration date, and manufacturer's name, and the tape sticking module 20 may have a reading device for reading the identification information on the IC chip. The identification information is read with the reading device at the time of installation of the feeding roller 30, enabling a feeding roller 30 that is not scheduled for use (e.g., a feeding roller 30 holding a protective tape 27 that is not scheduled for use, or a feeding roller 30 that has been already used) from being installed.

Further, in one embodiment, a stocker may be provided in the vicinity of the feeding roller 30, in which a plurality of feeding rollers 30 are housed. This stocker makes it possible to smoothly replace the feeding roller 30.

Returning to FIG. 5, the tape sticking unit 28 includes a tape holding head 20 for holding a beginning of the protective tape 27 and sticking the beginning onto the peripheral side surface (see the symbol B in FIGS. 1A and 1B) of the wafer W, a positioning roller 42 as a positioning member for performing positioning of the protective tape 27 in a direction perpendicular to the surface of the wafer W, and a side roller 43 for pressing the protective tape 27 against the peripheral side surface of the wafer W.

The tape sticking unit 28 further includes a first roller 46 for bending the protective tape 27, which has been pressed against the peripheral side surface of the wafer W, along a longitudinal direction of the protective tape 27 and sticking a bent portion of the protective tape 27 onto a first surface

Figure 9:
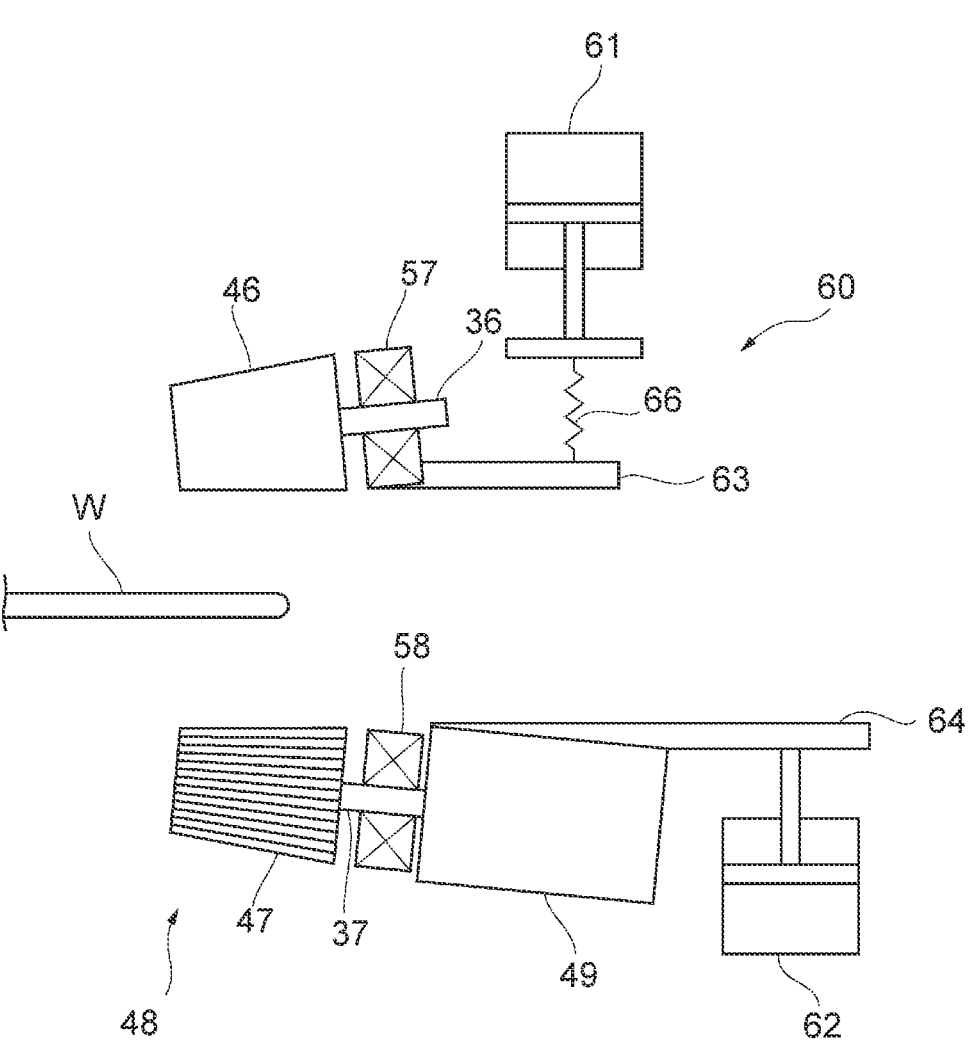
FIG. 9 is a schematic view showing a first roller, a second roller, and a nipping mechanism.

11 of the peripheral portion of the wafer W, and a second roller
47 (which is illustrated in FIG. 9) for sticking a bent portion
of the protective tape 27 onto a second surface of the
peripheral portion of the wafer W. The first roller 46 and the
second roller 47 are arranged adjacent to the side roller 43.
In this embodiment, the first surface of the peripheral portion
of the wafer W is an upper surface of the peripheral portion
of the wafer W and the second surface of the peripheral
portion of the wafer W is a lower surface of the peripheral
portion of the wafer W.

The first roller 46 and the second roller 47 are disposed at
positions as to sandwich the peripheral portion of the wafer
W from above and below. In this embodiment, the second
roller 47 is disposed below the first roller 46, and the
peripheral portion of the wafer W is placed between the first
roller 46 and the second roller 47. Since the second roller 47
is located below the first roller 46, only the first roller 26 is
shown in FIG. 5.

The tape holding head 40 is coupled to an electric cylinder
41 as a head actuator so that the tape holding head 40 can
move by the electric cylinder 21 in directions closer to and
away from the peripheral portion of the wafer W. The tape
holding head 40 is configured to be capable of detachably
holding the beginning of the protective tape 27. More
specifically, the tape holding head 40 is coupled to a vacuum
line 39 so that the tape holding head 40 can hold the
beginning of the protective tape 27 by vacuum suction
generated by the vacuum line 39.

Figure 8A:
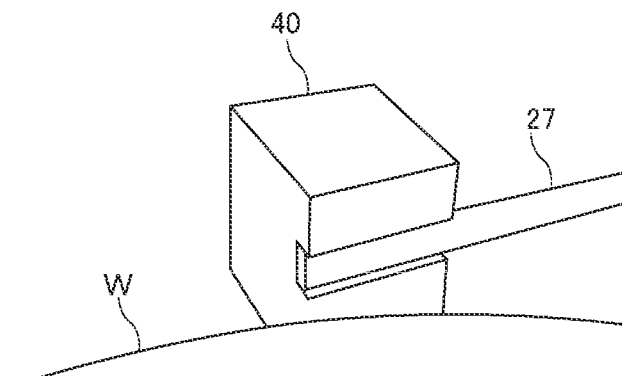
FIG. 8A is a perspective view showing a process of sticking a beginning of the protective tape on a peripheral side surface of the wafer with a tape holding head.
Figure 8B:
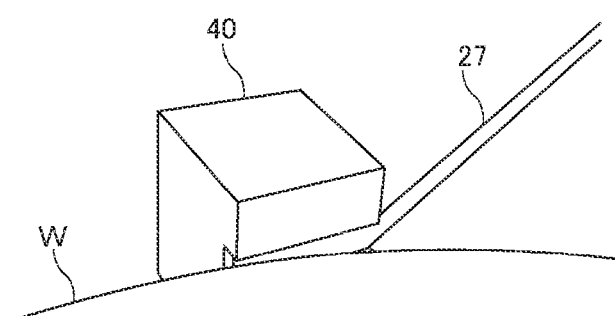
FIG. 8B is a perspective view showing a process of sticking the beginning of the protective tape on the peripheral side surface of the wafer with the tape holding head.
Figure 8C:
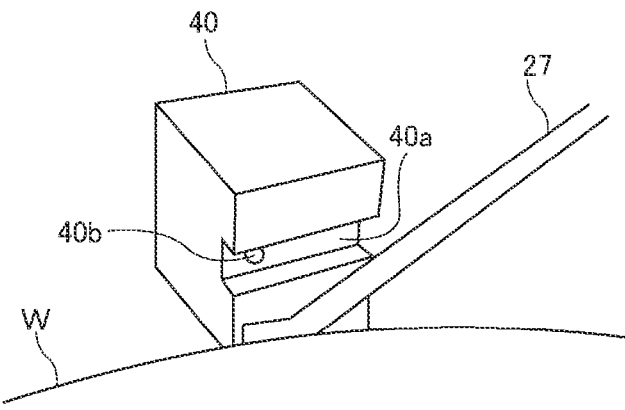
FIG. 8C is a perspective view showing a process of sticking the beginning of the protective tape on the peripheral side surface of the wafer with the tape holding head.

FIGS. 8A through 8C are perspective views each illus-
trating a process of sticking the beginning of the protective
tape 27 onto the peripheral side surface of the wafer W by
the tape holding head 40. A tape holding groove 20a,
extending parallel to the surface of the wafer W, is formed
in a front face of the tape holding head 20. A vacuum suction
opening 40b, which enables the tape holding head 20 to
detachably hold the beginning of the protective tape 27, is
formed in a bottom of the tape holding groove 20a. The
vacuum suction opening 40b communicates with the above-
described vacuum line 39.

The tape holding head 40 operates as follows. As shown
in FIG. 8A, the beginning of the protective tape 27 is held
to the tape holding head 40 by the vacuum suction. Next, as
shown in FIG. 8B, the electric cylinder 41 (see FIG. 5) is
actuated to move the tape holding head 40 toward the
peripheral side surface of the wafer W until the beginning of
the protective tape 27 comes into contact with the peripheral
side surface of the wafer W. Next, the vacuum suction by the
vacuum line 39 is shut off, and the tape holding head 40 is
moved away from the peripheral portion of the wafer W.
Operating of the tape holding head 20 in this manner causes
the beginning of the masking tape 7 to be stuck on the
peripheral side surface of the wafer W as shown in FIG. 8C.

As shown in FIG. 5, the positioning roller 42 and the side
roller 43 are rotatably secured to a common support 44. Axes
of the positioning roller 42 and the side roller 43 extend in
a direction perpendicular to the surface of the wafer W (i.e.,
in the vertical direction), respectively. The support 44 is
coupled to an air cylinder 45 as a roller actuator.

When the air cylinder 45 is set in motion, the positioning
roller 42 and the side roller 43 simultaneously move toward
the peripheral side surface of the wafer W. The direction of
the movement of the positioning roller 42 and the side roller
43 is parallel to the surface of the wafer W. The positioning
roller 42 and the side roller 43 are arranged at different
positions in the movement direction. Therefore, as shown in
FIG. 5, while the side roller 43 presses the protective tape 27
against the peripheral side surface of the wafer W, the positioning roller 42 only comes into contact with the back
surface (i.e., the surface opposite to the adhesive surface) of
the protective tape 27, and dose not press the protective tape
27 against the peripheral side surface of the wafer W. The
positioning roller 42 and the side roller 43 may be coupled
to different air cylinders, respectively.

The tape sticking unit 28 further includes a nipping
mechanism 60 that causes the first roller 46 and the second
roller 47 to nip the peripheral portion of the wafer W. FIG.
9 is a schematic view showing the first roller 46, the second
roller 47, and the nipping mechanism 60. The first roller 46
and the second roller 47 are fixed to the rotational shaft 36
and the rotational shaft 37, respectively. The rotational shaft
36 and the rotational shaft 37 are rotatably supported by
bearings 57 and 58, respectively. A shaft center of the first
roller 46 coincides with a shaft center of the rotational shaft
36, and the first roller 46 is configured to be rotatable around
the shaft center of the rotational shaft 36. A shaft center of
the second roller 47 coincides with a shaft center of the
rotational shaft 37, and the second roller 47 is configured to
be rotatable around the shaft center of the rotational shaft 37.

The tape sticking unit 28 further includes a roller-driving
motor 49 for rotating the second roller 47. The rotational
shaft 37 is coupled to the roller-driving motor 49. The
second roller 47 is coupled to the roller-driving motor 49
through the rotational shaft 37. When the roller-driving
motor 49 is set in motion, the rotary shaft 37 is rotated, and
thus the second roller 47 is rotated. The first roller 46 is
configured to be rotatable, but is not coupled to rotary driver,
such as a motor.

The nipping mechanism 60 includes moving mechanisms
61, 62 that move the first roller 46 and the second roller 47
in directions closer to and away from the peripheral portion
of the wafer W, respectively, bridges 63 and 64 that are
coupled to the moving mechanisms 61, 62, respectively, and
a spring 66 coupling the moving mechanism 61 to the bridge
63. The first roller 46 and the second roller 47 are coupled
to the nipping mechanism 60. Specifically, the first roller 46
is coupled to the bridge 63 through the rotational shaft 36
and the bearing 57, and the second roller 47 is coupled to the
bridge 64 through the rotational shaft 37 and the roller-
driving motor 49. Positions of the moving mechanisms 61,
62 are fixed.

The moving mechanisms 61 and 62 is composed of air
cylinders and the like, respectively. When this moving
mechanism 61 is operated, the first roller 46 is moved in
directions closer to and away from the second roller 47 (i.e.,
in the directions closer to and away from the peripheral
portion of the wafer W) integrally with the rotational shaft
36, the bearing 57, the bridge 63, and the spring 66. When
the movement mechanism 62 is operated, the second roller
47 is moved in directions closer to and away from the first
roller 46 (i.e., in the directions closer to and away from the
peripheral portion of the wafer W) integrally with the
rotational shaft 37, the bearing 58, the roller-driving motor
49, and the bridge 64. The directions of movement of the
first roller 46 and the second roller 47 are directions per-
pendicular to the surface of the wafer W, respectively. In one
embodiment, each of the movement mechanisms 61, 62 may
be composed of a combination of a servo motor, a ball screw
mechanism, and a motor driver. The moving mechanism 61,
62 move the rollers 46, 47 in the direction closer to the
peripheral portion of the wafer W, respectively until they
come into contact with the wafer W. These operations enable
the first roller 46 and the second roller 47 to nip the
peripheral portion of the wafer W.

When the first roller 46 comes into contact with the wafer W, the first roller 46, the rotational shaft 36, the bearing 57, the spring 66, and the bridge 63 cannot move down any further. When, in this state, the movement mechanism 61 is further operated (applies a downward force to the spring 66), a repulsive force is generated in the spring 66, so that the spring 66 applies a downward force (in the direction of the wafer W) corresponding to the above repulsive force to the bridge 63. This downward force generated by the spring 66 is transmitted to the first roller 46 through the rotational shaft 36 and the bearing 57. Therefore, the first roller 46 presses the peripheral portion of the wafer W with a pressing force including the above downward force (or presses the protective tape 27 against the peripheral portion of the wafer W).

With this structure, the first roller 46 and the second roller 47 can nip the wafer W from above and below with appropriate force, and the protective tape 27 can be folded along its longitudinal direction to press the folded portions against the top and bottom surfaces of the peripheral portion of the wafer W. The pressing force to press the peripheral portion of the wafer W (or to press the protective tape 27 against the peripheral portion of the wafer W) can be, for example, controlled by regulating air pressures of the movement mechanisms 61, 62, composed of air cylinder and the like.

Figure 10:
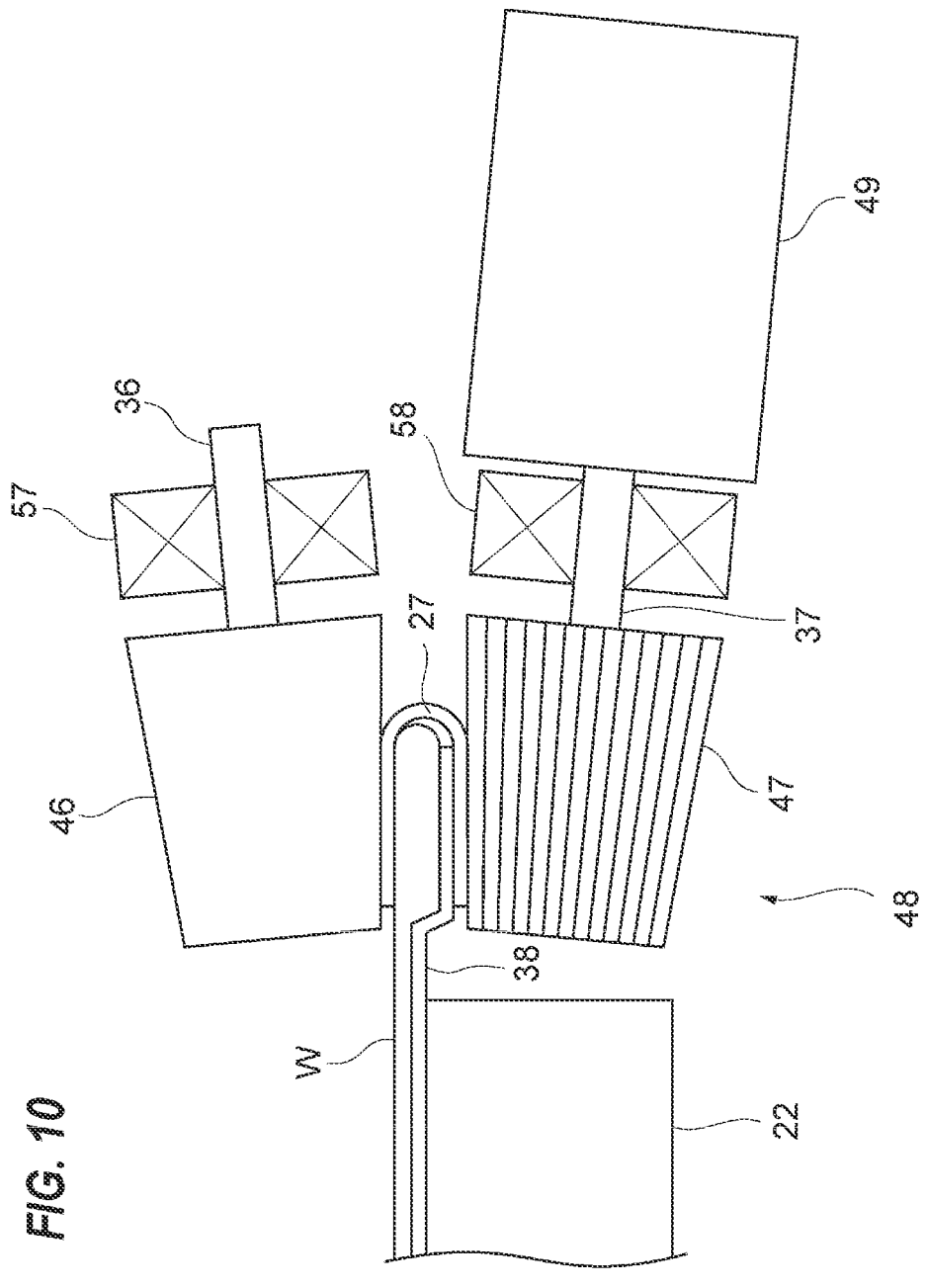
FIG. 10 is an enlarged view showing a state where the wafer and the protective tape are nipped by the first roller and the second roller.
Figure 11:
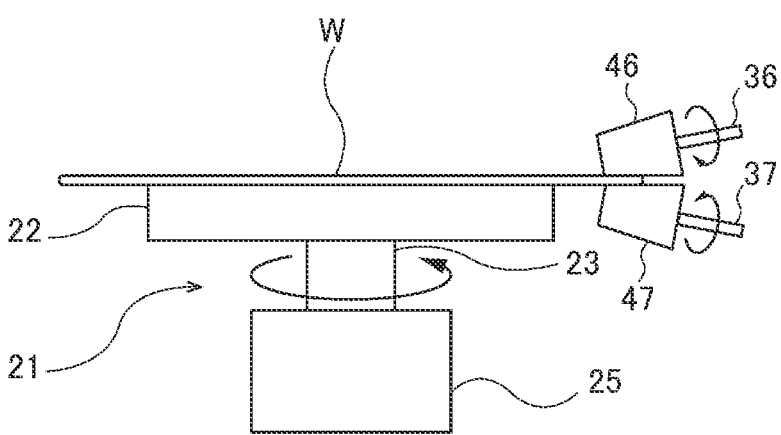
FIG. 11 is a view showing a state of rotating the first roller, the second roller, the wafer, a substrate stage, and a shaft.

FIG. 10 is an enlarged view showing a state where the wafer W and the protective tape 27 are nipped by the first roller 46 and the second roller 47. When, in a state where the wafer W is held by the substrate holder 21 for sticking, the roller-driving motor is set in motion while nipping the peripheral portion of the wafer W with the first roller 46 and the second roller 47 (i.e., pressing the upper surface and the bottom surface of the peripheral portion of the wafer W with the first roller 46 and the second roller 47), the wafer W, the first roller 46, the substrate stage 22, and the shaft 23 are rotated as the second roller 47 is rotated. The first roller 46 and the second roller 47 can nip the wafer from above and below with the appropriate force by use of the nipping mechanism 60, so that a feed force to the peripheral portion of the wafer W from the second roller 47 (a force to rotate the wafer W) is accurately transmitted. FIG. 11 illustrates a state of rotating the first roller 46, the second roller 47, the wafer W, the substrate stage 22, and the shaft 23.

As described above, the protective tape 27 is stuck on the peripheral portion of the wafer W with the desired tension applied by the tension unit 31. In other words, the protective tape 27 is pressed against the peripheral portion of the wafer W by the side roller 43 while being pulled in an opposite direction to the direction of rotation of the wafer W by the tension unit 31. Thus, a force in the opposite direction to the direction of rotation of the wafer W is applied to a position with which the protective tape 27 is pressed.

For example, in a tape sticking apparatus having a roller corresponding to a second roller that is not coupled to a drive source, such as a motor, a motor coupled to the substrate stage is driven to rotate the substrate stage, thereby rotating the wafer held to the substrate stage. In this case, the force to rotate the wafer is applied radially inward of the position against where the protective tape is pressed. As a result, a distance in the radial direction of the wafer between the position where the force in the direction of rotation of the wafer W is applied, and the position where the protective tape is pressed is greater, and thus a greater load is applied to the wafer.

In such apparatus, the larger the diameter of the wafer, the greater the distance in the radial direction of the wafer between the place where the force in the direction of rotation of the wafer W is applied, and the place where the protective tape is pressed. Therefore, if the tape sticking apparatus described above (the tape sticking apparatus having a roller corresponding to a second roller that is not coupled to a drive source, such as a motor) is used, the wafer may be damaged. For example, when the tape sticking apparatus described above (the tape sticking apparatus having a roller corresponding to a second roller that is not coupled to a drive source, such as a motor) is used to a larger diameter of TAIKO wafer (e.g., 300 mm wafer) having the same thickness (50 μm or less) as a 200 mm diameter of TAIKO wafer, stress concentration may occur in a boundary area between the center portion and the edge of the TAIKO wafer, damaging the mechanical strength of the wafer. Thus, there may become higher risk of wafer breakage.

According to this embodiment, the force to rotate the wafer W is applied to the peripheral portion of the wafer W, so that the distance in the radial direction of the wafer W between the place where the force in the direction of rotation of the wafer W is applied and the place where the protective tape is pressed can be decreased. Therefore, the load applied to the wafer W can be reduced, and thus the damage to the wafer W can be prevented. Further, in this embodiment, the rollers 46, 47 are disposed adjacent to the side roller 43, so that the place where the force in the direction of rotation of the wafer W is applied can be brought closer to the place where the protective tape is pressed. As a result, the load to the wafer W can be further reduced.

In this embodiment, the second roller 47 is arranged below the first roller 46, thereby preventing dust generated from the roller-driving motor 49 from falling on the surface of the wafer W and contaminating the surface of the wafer W. In one embodiment, the second roller 47 may be disposed above the first roller 46, and the peripheral portion of the wafer W may be placed between the first roller 46 and the second roller 47. In this case, the first surface of the peripheral portion of the wafer W is the lower surface of the peripheral portion of the wafer W, and the second surface of the peripheral portion of the wafer W is the upper surface of the peripheral portion of the wafer W.

The first roller 46, the rotational shaft 36, the bearing 57, the second roller 47, the rotational shaft 37, the bearing 58, and the roller-driving motor 46 constitutes the rotating device 48 for rotating the wafer W.

As described above, the protective tape 27 is stuck to the peripheral portion of the wafer W with the desired tension applied by the tension unit 31. In other words, when the protective tape 27 is pressed against the peripheral portion of the wafer W, the tension unit 31 is pulling the protective tape 27 in a tangential direction of the wafer W. In this embodiment, the first roller 46 and the second roller are made of rubber. Using rubber as material of the first roller 46 and the second roller 47 can prevent the protective tape 27 from being pulled and shifted. Examples of rubber include urethane rubber and silicone rubber.

When viewed from a direction perpendicular to the surface of wafer W (a direction perpendicular to the substrate holding surface of substrate stage 22), the axes of the rollers 46, 47 and the axes of the rotational shafts 36, 37 extend in the radial direction of wafer W (see FIG. 5), while the axes of the rollers 46, 47 and the axes of the rotational shafts 36, 37 are arranged to be inclined in a direction perpendicular to the surface of the wafer W. Specifically, the rollers 46, 47, the rotational shafts 36, 37, and the roller-driving motor 49 are arranged so that tips of the rollers 46, 47 are inclined toward the surface of the wafer W. The first roller 46 and the second roller 47 have a tapered shape with a gradually decreasing cross-sectional area toward the tip, respectively. According to this structure, the circumferences of the cross section of the rollers 46 and 47 become shorter toward the inside of the wafer W in the radial direction, respectively. As a result, it is possible to prevent the protective tape 27 from being stuck in a twisted manner.

The positioning roller 42 and the side roller 43 are configured to be rotatable, but are not coupled to a rotary drive, such as a motor. Therefore, these rollers 42 and 43 are rotated by contact with the protective tape 27, which is moved by the rotation of the wafer W.

Figure 12A:
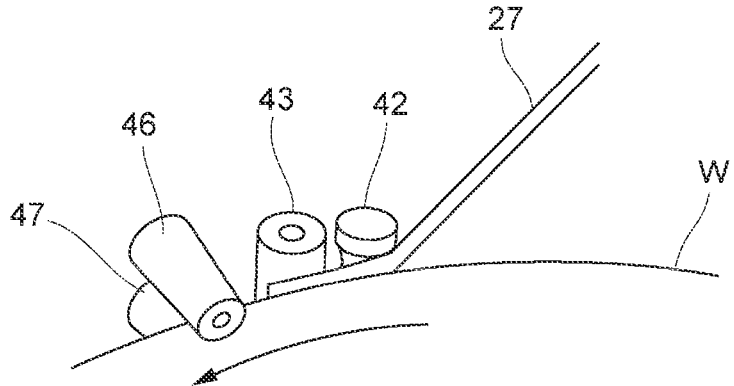
FIG. 12A is a perspective view showing a state in which the protective tape is stuck on the peripheral portion of the wafer.

Next, the operation of the tape sticking unit 28 will now be described. First, as shown in FIGS. 8A through 8C, the beginning of the protective tape 27 is stuck on the peripheral side surface of the wafer W by the tape holding head 40. Next, the positioning roller 42 and the side roller 43 are moved toward the wafer W until the side roller 43 comes into contact with the peripheral side surface of the wafer W. With the beginning of the protective tape 27 stuck on the peripheral side surface, the first roller 46 and the second roller 47 are moved by the nipping mechanism 60 in a direction close to each other, thereby nipping the wafer W with the desired force by use of the rollers 46, 47. Then, the roller-driving motor 49 is driven while the wafer W is nipped by the rollers 46, 47. As a result, the wafer W is rotated around its axis. As shown in FIG. 12A, the positioning roller 42 is disposed upstream of the side roller 43 with respect to the direction of movement of the protective tape 27. Accordingly, the protective tape 27 is guided by the positioning roller 42 and the side roller 43 in this order.

The vertical position of the protective tape 27 is fixed by the positioning roller 42. Specifically, the positioning roller 42 has a drum-like shape with a narrow middle portion, and the protective tape 27 is guided by this narrow portion, thereby positioning the protective tape 27 in the vertical direction. The protective tape 27 which has passed the positioning roller 42 is pressed with a predetermined force by the side roller 43 against the peripheral side surface of the wafer W, whereby the protective tape 27 is stuck on the peripheral side surface of the wafer W.

Figure 12B:
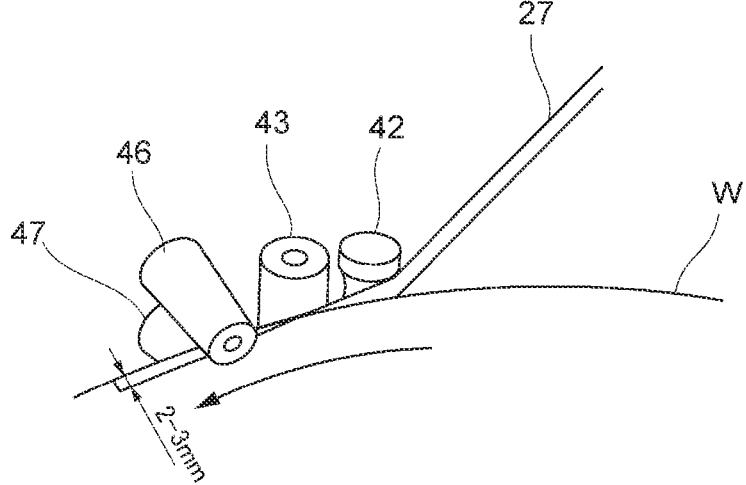
FIG. 12B is a perspective view showing a state in which the protective tape is stuck on the peripheral portion of the wafer.

The side roller 43 is made of an elastic material, such as urethane rubber. Therefore, when the side roller 43 presses the protective tape 27 with a predetermined force against the peripheral side surface of the wafer W, a circumferential surface of the side roller 43 is dented in conformity with the shape of the peripheral portion of the wafer W. As a result, as shown in FIG. 12B, the entirety of the protective tape 27 is bent inwardly in the radial direction of the wafer W along the dented circumferential surface of the side roller 43.

Figure 12C:
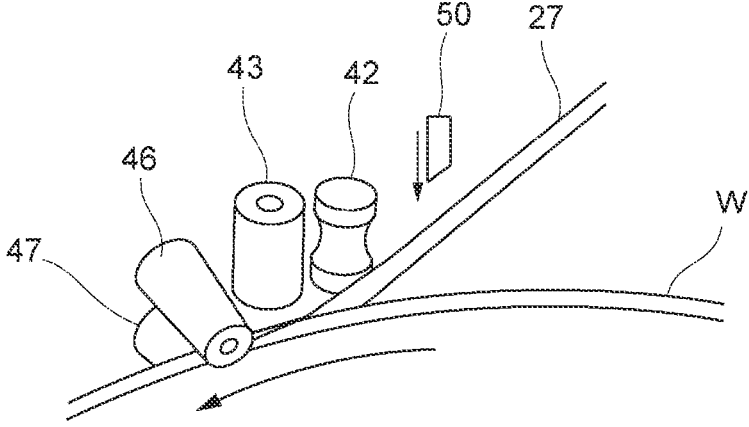
FIG. 12C is a perspective view showing a state in which the protective tape is stuck on the peripheral portion of the wafer.
Figure 13:
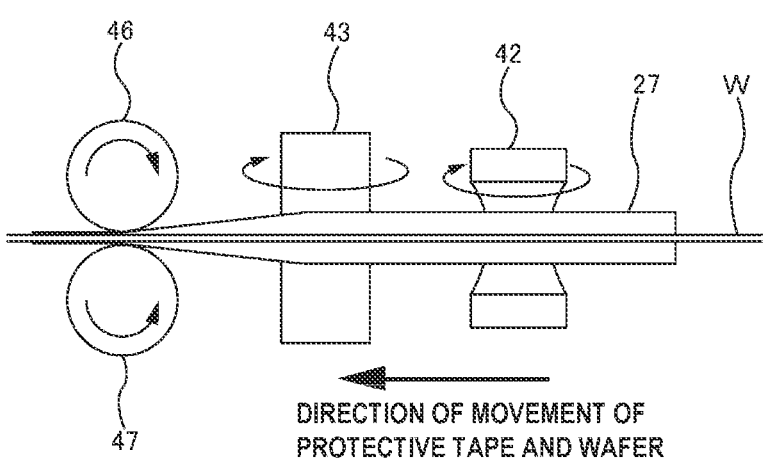
FIG. 13 is a side view showing a state in which the protective tape is stuck on the peripheral portion of the wafer.

As the wafer W rotates, the protective tape 27 reaches the first roller 46 and the second roller 47. The protective tape 27, which has been bent by the side roller 43, is nipped with a predetermined force by the first roller 46 and the second roller 47. As shown in FIGS. 12B and 13, an upper half of the protective tape 27 is bent by the first roller 46 along the longitudinal direction of the protective tape 27 and pressed against the upper surface (the first surface) of the peripheral portion of the wafer W. At the same time, a lower half of the protective tape 27 is bent by the second roller 47 along the longitudinal direction of the protective tape 27 and pressed against the lower surface (the second surface) of the peripheral portion of the wafer W. The protective tape 27 is stuck on the peripheral portion of the wafer W in this manner. Further, by making one rotation of the wafer W, the protective tape 27 is stuck on the entire peripheral portion of the wafer W as shown in FIG. 12C.

As shown in FIG. 5, the tape sticking unit 28 may have a third roller 54 and a fourth roller 55. The third roller 54 is disposed above the fourth roller 55, and the peripheral portion of the wafer W is placed between the third roller 54 and the fourth roller 55. Since the fourth roller 55 is located below the third roller 54, only the third roller 54 is illustrated in FIG. 5.

The third roller 54 and the fourth roller 55 are configured to be rotatable around their axes. The axes of the third roller 54 and the fourth roller 55 extend parallel to the surface of the wafer W and extend in the radial direction of the wafer W, respectively. The third roller 54 and the fourth roller 55 are coupled to a moving device 56 composed of an air cylinder and the like. When the moving device 56 is set in motion, the third roller 34 and the fourth roller 35 move in directions closer to and away from each other (i.e., in the directions closer to and away from the peripheral portion of the wafer W). The directions of movement of the third roller 34 and the fourth roller 35 are perpendicular to the surface of the wafer W.

With such structure, the third roller 54 and the fourth roller 55 press again the protective tape 27, which has been stuck on the peripheral portion of the wafer W by the first roller 46 and the second roller 47, against the peripheral portion of the wafer W. Therefore, the protective tape 27 can be securely stuck on the peripheral portion of the wafer W by the third roller 54 and the fourth roller 55. The pressing force at which the third roller 34 and the fourth roller 35 press the protective tape 27 against the peripheral portion of the wafer W can be controlled, for example, by regulating air pressure of the moving device 56 composed of an air cylinder and the like.

In one embodiment, the third roller 54 and the fourth roller 55 may have a tapered shape with a gradually decreasing cross-sectional area toward the tip, respectively. Further, the third roller 54 and the fourth roller 55 may be arranged so that the tips of the rollers 54, 55 are inclined toward the surface of the wafer W.

A width of each of the bent portions of the protective tape 27 is within a range of 2 mm to 3 mm. The width of the bent portion of the protective tape 27 that is stuck on the upper surface of the peripheral portion of the wafer W (hereinafter referred to as upper-side tape width), may be equal to or different from the width of the bent portion of the protective tape 27 that is stuck on the lower surface of the peripheral portion of the wafer W (hereinafter referred to as lower-side tape width). In general, the wafer W is held on the substrate stage 22 of the substrate holder 21 for sticking with the device formed thereon facing upward. In this case, the upper-side tape width may be larger than the lower-side tape width. A proportion of the upper-side tape width to the lower-side tape width can be controlled by the vertical position of the positioning roller 22.

Figure 14:
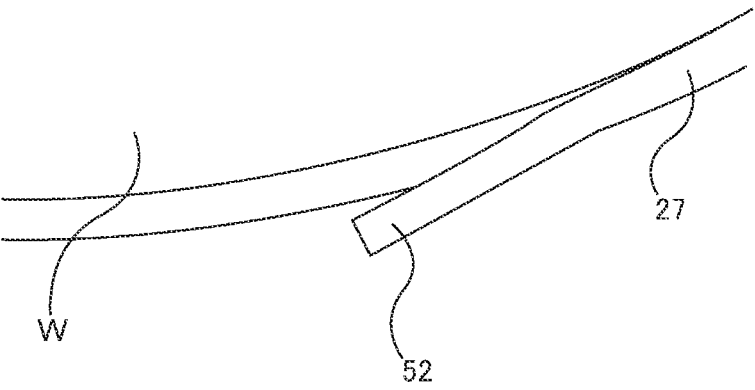
FIG. 14 is a view showing a projecting end portion of the protective tape cut by a tape cutter.

After completion of the tape sticking process, the protective tape 27 is cut by a tape cutter 50 as shown in FIG. 12C. After the protective tape 27 is cut, the wafer W is rotated with the protective tape 27 interposed between the first roller 46 and the second roller 47, thereby forming a projecting end portion 52 which is the end portion of the protective tape 27 projecting from the peripheral portion of the wafer W, as shown in FIG. 14.

Returning to FIG. 3, the tape heating apparatus 15 includes a heating stage 15a on which the wafer W is placed, and a heater (not shown) for heating the heating stage 15a. The wafer W with the protective tape 27 stuck on the peripheral portion is placed on the heating stage 15a to heat the protective tape 27. This heating enables an adhesive strength of the protective tape 27 after sticking to be increased.

In this embodiment, the tape sticking system 1 includes the plurality (three in the illustrated example) of tape heating apparatuses 15. However, the number of tape heating apparatuses 15 is not limited to this embodiment. The tape sticking system 1 may have one tape heating apparatus 15, or four or more tape heating apparatuses 15. Provision of the plurality of tape heating apparatuses 15 enables the plurality of wafers W to be heated simultaneously.

In one embodiment, the tape heating apparatus 15 may be a spot heater arranged so that heat is applied only to the protective tape 27 attached to the peripheral edge of the wafer W. The tape heating apparatus 15 is arranged at a position where heat can be applied only to the protective tape 27, such as in the vicinity of the substrate stage 22, and the wafer W is rotated by the rotating device 48 to apply heat to the entire protective tape 27. You can guess. Examples of spot heaters include infrared spot heaters that emit infrared rays and infrared lamp type heaters.

Figure 15:
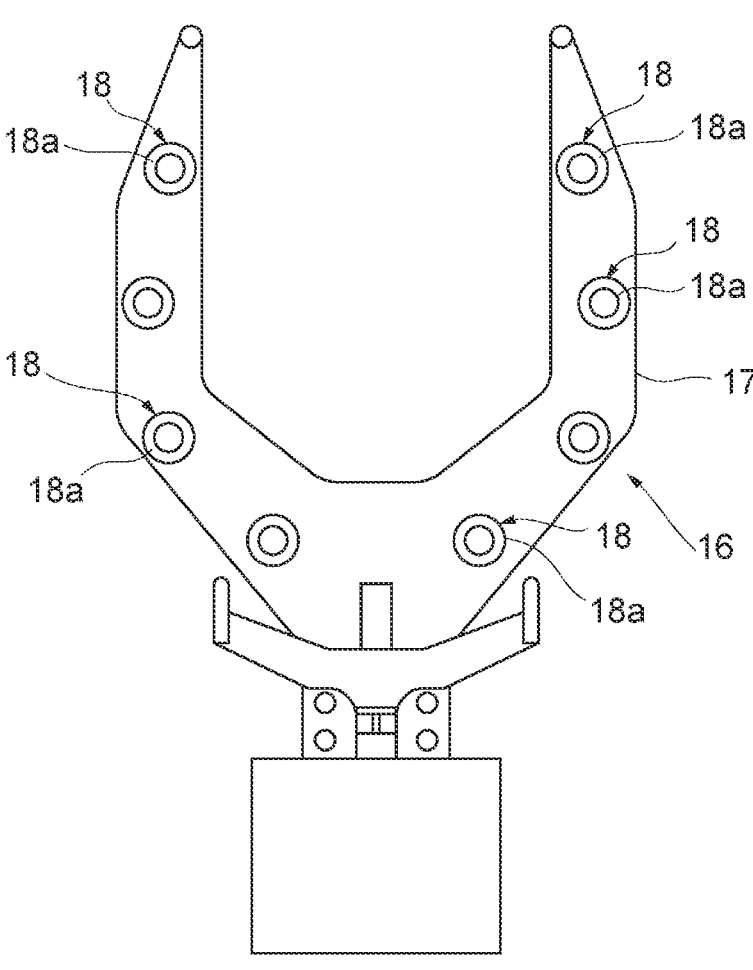
FIG. 15 is a schematic view showing a Bernoulli hand.

Returning to FIG. 3, the transfer robot 13 includes a Bernoulli hand 16 for holding the wafer W, and a swiveling-elevating mechanism (not shown) for swiveling and/or elevating the Bernoulli hand 16. FIG. 15 is a schematic view showing the Bernoulli hand 16. As shown in FIG. 15, the Bernoulli hand 16 has a base 17, and a plurality of chucks 18 connected to the base 17. The Bernoulli hand 16 is configured to attract the lower surface of the wafer W through a fluid in a non-contact manner. The Bernoulli hand 16 is a mechanism for holding the wafer W using Bernoulli's theorem.

Specifically, a fluid (e.g., gas, such as clean air, and inert gas, or liquid such as pure water) is ejected outwardly from a periphery of the suction surface 18a of the chuck 18, thereby creating a negative pressure in a space between a central portion of the suction surface 18a and the lower surface of the wafer W. The chuck 18 thus generates a suction forces in the central portion of the suction surface 18a, and attracts the wafer W. Since the flow of fluid is formed in the space between the periphery of the suction surface 18a and the wafer W, the chuck 18 can attract the wafer W in a non-contact manner. Therefore, the wafer W can be attracted while keeping the lower surface of the wafer W clean. As a result, the adhesive strength of the protective tape 27 can be maintained without contaminating the peripheral portion of the wafer W. Further, without being affected by bending of the center portion due to the thinner center of the wafer W when TAIKO wafer is used as the wafer W, and handling speed can be increased.

Figure 16:
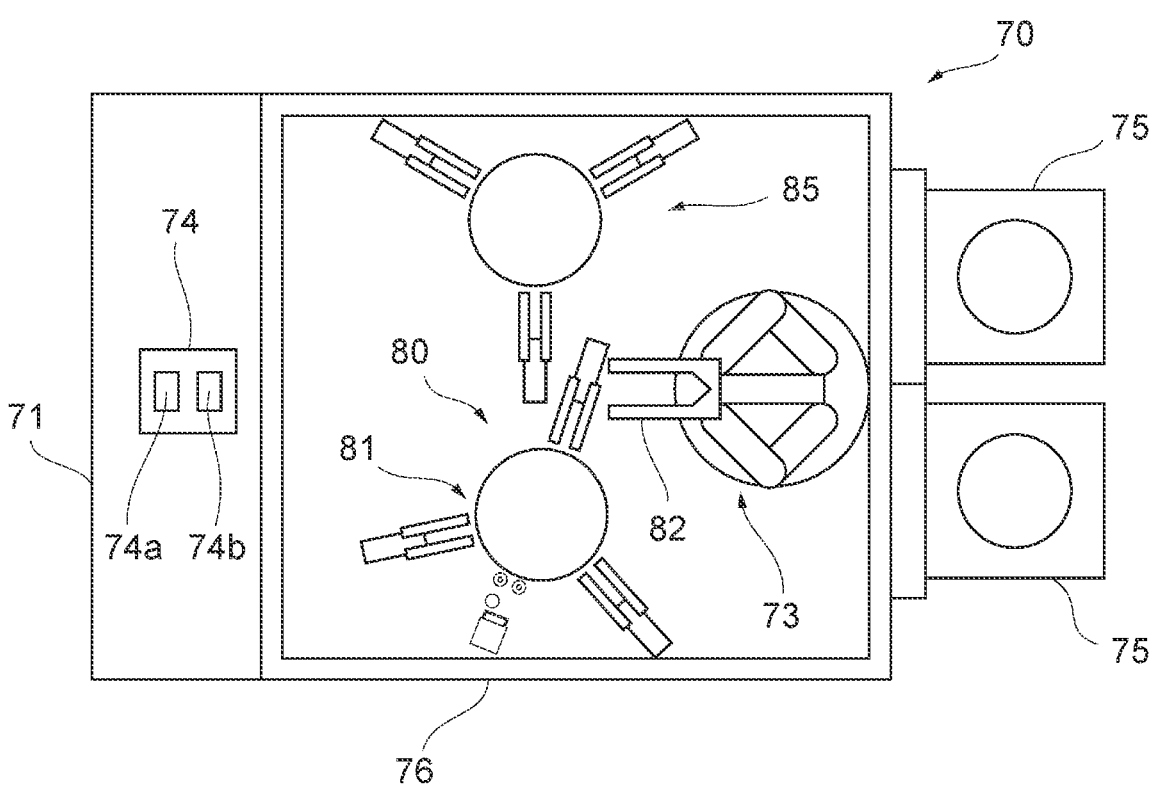
FIG. 16 is a plan view schematically showing a tape peeling system according to one embodiment.
Figure 17:
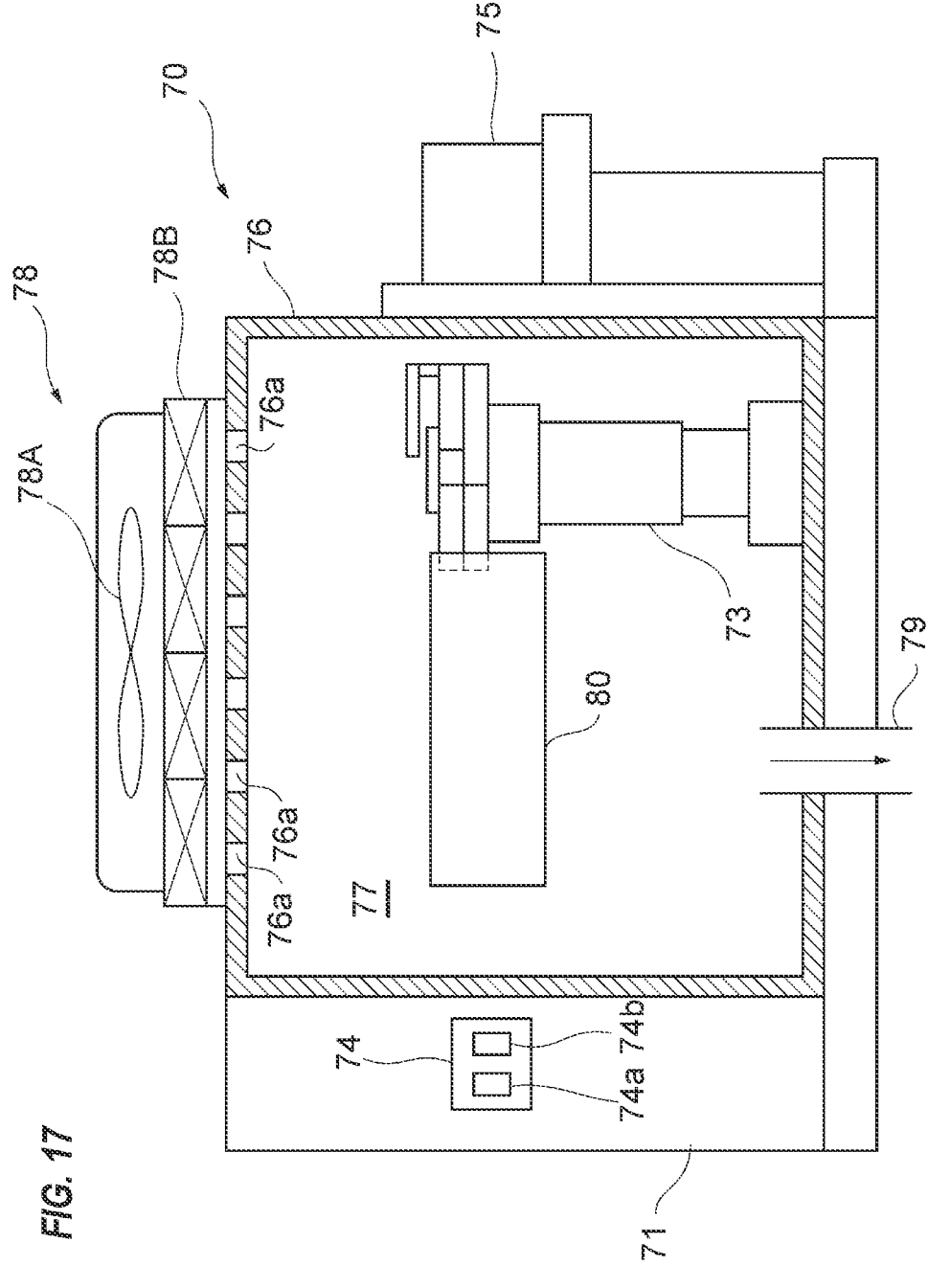
FIG. 17 is a side view schematically showing the tape peeling system shown in FIG. 16.

FIG. 16 is a plan view schematically showing a tape peeling system according to one embodiment, and FIG. 17 is a side view schematically showing the tape peeling system shown in FIG. 16. The tap peeling system 70 includes a tape peeling apparatus 80 for peeling the protective tape 27 from the peripheral portion of the wafer W, a transfer robot 73 for transferring the wafer W to the tape peeling apparatus 80, and a plurality of load ports 75 for receiving thereon wafer cassettes (substrate cassettes) each storing a number of wafers therein, and a power controller 71.

The power controller 71 includes a power supply (not shown), and an operation controller 74 for controlling operations of the tape peeling apparatus 80 and the transfer robot 73. The tape peeling apparatus 80 and the transfer robot 73 are electrically connected to the operation controller 74. The operation controller 74 is configured to command to each component of the tape peeling apparatus 80 and the transfer robot 73 to thereby control operations of each component of the tape peeling apparatus 80 and the transfer robot 73.

The operation controller 74 is constituted by at least one computer. The operation controller 74 includes a memory 74a storing programs therein, and an arithmetic device 74b configured to perform arithmetic operations according to instructions contained in the programs. The memory 74a includes a main memory, such as a RAM, and an auxiliary memory, such as a hard disk drive (HDD) or a solid state drive (SSD). Examples of the arithmetic device 74b include a CPU (central processing unit) and a GPU (graphic processing unit). However, the specific configuration of the operation controller 74 is not limited to these examples.

The load port 75 can be mounted with an open cassette, a SMIF (Standard Manufacturing Interface) pod, or a FOUP (Front Opening Unified Pod). The transfer robot 73 is configured to transfer the wafer W between the load port 75 and the tape peeling apparatus 80. Further, the transfer robot 73 is configured to transfer the wafer W between the tape peeling module 81, which will be described later, and the UV irradiation module 85.

As shown in FIG. 17, the tape peeling apparatus 70 includes a partition wall 76 and a ventilating device 78. An inside space of the partition wall 76 provides a processing chamber 77. The tape peeling apparatus 80 and the transfer robot 73 are disposed in the processing chamber 77. The partition wall 76 has a door (not shown), so that the wafer W can be carried into the processing chamber 77 through the door, and can be carried out from the processing chamber 77 through the door.

Clean-air intakes 76a are formed in an upper portion of the partition wall 76, and a local exhaust ventilation 79 for sucking and exhausting dusts, particles, or the like in the space, is formed below the tape peeling apparatus 80 (i.e., in a lower portion of the partition wall 76). The ventilating device 78 is provided on an upper surface of the partition wall 76. The ventilating device 78 includes a fan 78A, and a filter 78B for removing particles and dusts contained in an air sent from the fan 78A. The ventilating device 78 is configured to send a clean air into the processing chamber 77 through the clean-air intakes 76a, and discharge a gas in the processing chamber 77 from the local exhaust ventilation 79. Therefore, the clean air forms a down flow in the processing chamber 77. As a result, contamination of the surface of wafer W due to fluttering particles and adhesion of dusts to the peripheral portion of the wafer W can be prevented.

The tape peeling device 80 includes the tape peeling module 81 for rotating the wafer W and peeling off the protective tape from the peripheral portion of the wafer W, and the UV irradiation module 85 for irradiating ultraviolet ray to the protective tape 27 that has been stuck on the peripheral portion of the wafer W. The transfer robot 73 includes a Bernoulli hand 82 for holding the wafer W, and a swiveling-elevating mechanism (not shown) for swiveling and/or elevating the Bernoulli hand 82. The Bernoulli hand 82 is configured to attract the lower surface of the wafer W through a fluid in a non-contact manner. The Bernoulli hand 16 is a mechanism for holding the wafer W using Bernoulli's theorem. The configuration of Bernoulli hand 82 is the same as that of Bernoulli hand 16. The Bernoulli hand 82 enables the wafer W to be attracted while keeping the lower surface of the wafer W clean.

Figure 18:
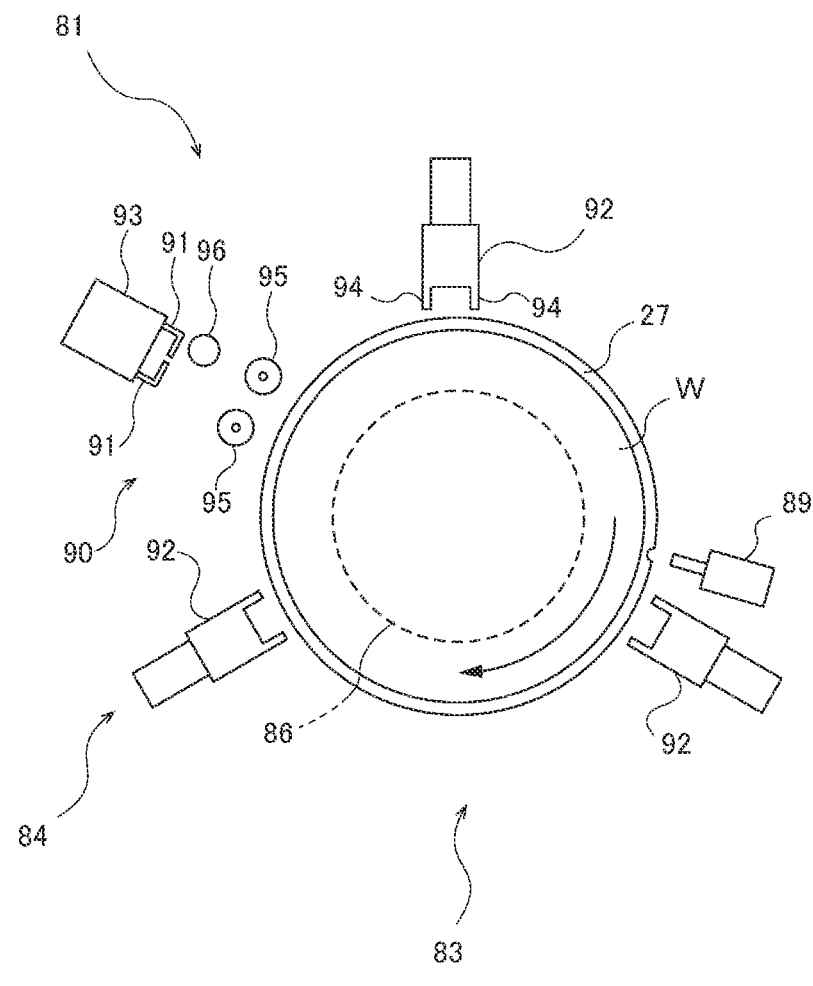
FIG. 18 is a schematic view showing a tape peeling module.

FIG. 18 is a schematic view showing the tape peeling module 81. The tape peeling module 81 includes a substrate holder 83 for peeling for holding and rotating the wafer W, and a tape peeling unit 90 for peeling the protective tape 27 from the rotating wafer W.

Figure 19:
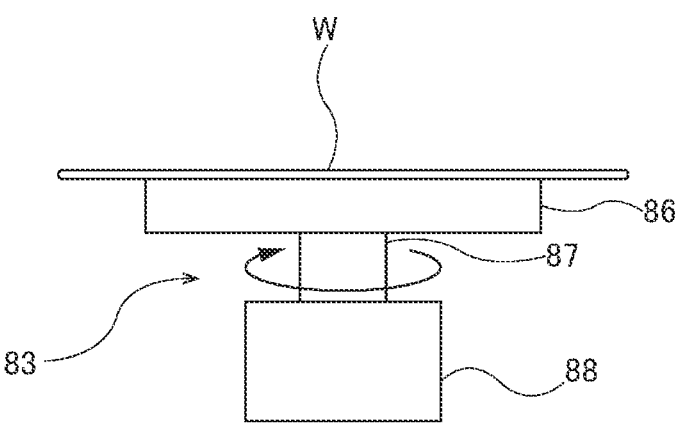
FIG. 19 is a side view showing the substrate holder for peeling.

FIG. 19 is a side view showing the substrate holder 83 for peeling. As shown in FIG. 19, the substrate holder 83 for peeling includes a substrate stage 86 for holding the wafer W horizontally, a shaft 87 secured to a center of a lower surface of the substrate stage 86, and a stage motor 88 for rotating the shaft 87 and the substrate stage 86. The substrate stage 86 is coupled to a vacuum source, which is not shown in the drawings, so that the wafer W can be held to an upper surface of the substrate stage 86 (i.e., substrate holding surface) by vacuum suction force generated by the vacuum source. When the stage motor 88 is set in motion, the shaft 87 rotates in a direction of arrow illustrated in the drawing, and the substrate stage 86 and the wafer W placed on the substrate stage 86 rotate in accordance with the rotation of the shaft 87.

As shown in FIG. 18, the substrate holder 83 for peeling further includes a centering mechanism 84 for centering the wafer W before holding the wafer W to the substrate stage 86 by the vacuum suction. The centering mechanism 86 is composed of a plurality of (e.g., three as illustrated) centering fingers 92 arranged at equal intervals along a circumferential direction of the wafer W. Each centering finger 92 has, at its front end, two projecting portions (finger portions) 94 capable of touching the peripheral portion of the wafer W. The configuration and operation of the centering finger 92 are the same as those of the centering finger 32. The substrate holder 83 for peeling further includes a notch detector 89 which can detect a notch of the wafer W.

Figure 20:
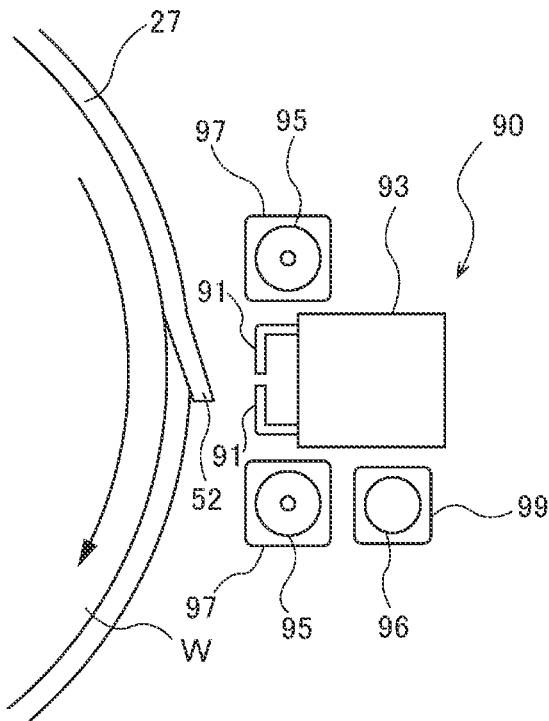
FIG. 20 is a schematic view showing a tape peeling unit.

FIG. 20 is a schematic view showing the tape peeling unit 90. As shown in FIG. 20, the tape peeling unit 90 includes a chucking mechanism 93 for holding the end of the protective tape 27 and drawing the protective tape 27 from the wafer W. The chucking mechanism 93 has a pair of chucking members (e.g., chucking claws) 91, 91 for holding the projecting end portion 52 of the protective tape 27. The chucking mechanism 93 is configured to be capable of moving toward and away from the wafer W.

The tape peeling unit 90 further includes a pair of tape advancing rollers 95, 95 for peeling the protective tape 27 from the wafer W while advancing the protective tape 27 at a speed which is synchronous with the rotational speed of the wafer W, and a take-up roller 96 for winding thereon the protective tape 27 advanced from the tape advancing rollers 95, 95. One of the tape advancing rollers 95, 95 is coupled to a motor 97, and the take-up roller 96 is coupled to a motor 99. The rollers 45, 46 are rotated at predetermined speeds by these motors 47, 49, respectively.

Figure 21A:
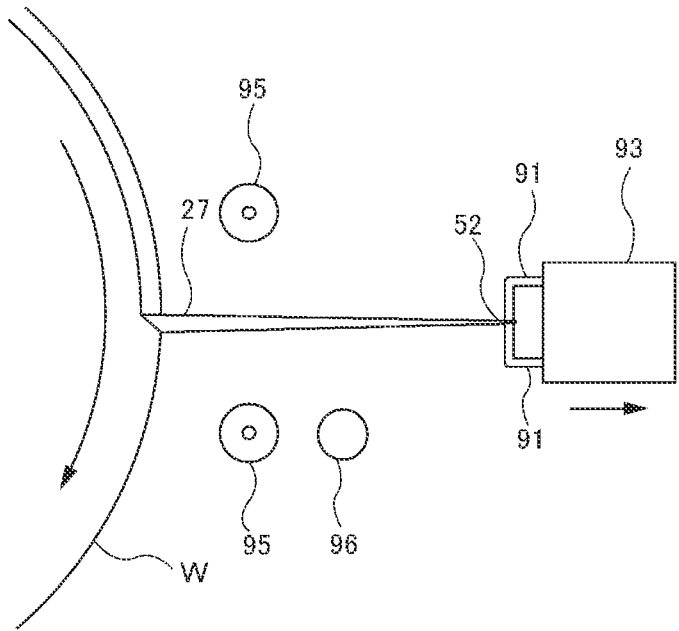
FIG. 21A is a view showing a state in which the protective tape is peeled off from the wafer.

The tape peeling unit 90 operates as follows. First, as shown in FIG. 20, the wafer W is rotated by the substrate holder 93 for peeling until the projecting end portion 52 comes to a position in front of the chucking mechanism 93. The chucking mechanism 93 moves toward the wafer W, and holds the projecting end portion 52 with the chucking members 91, 91. Subsequently, as shown in FIG. 21A, the wafer W is rotated while the chucking mechanism 43 is moved backward in a state where the projecting end portion 32 is held with the chucking members 91, 91. During this operation, the backward movement speed of the chucking mechanism 93 is synchronized with the rotational speed of the wafer W such that an angle between the protective tape 27 peeled from the wafer W and a tangential direction of the wafer W is 90°.

Figure 21B:
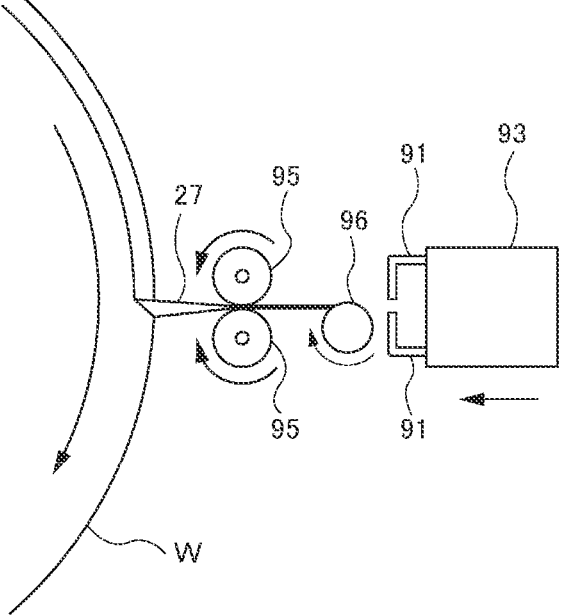
FIG. 21B is a view showing a state in which the protective tape is peeled off from the wafer.

After the backward movement of the chucking mechanism 93 is terminated, the tape advancing rollers 95, 95 approach each other to nip the peeled protective tape 27 between them as shown in FIG. 21B. The take-up roller 96 is moved until it comes into contact with the peeled portion of the protective tape 27. In this state, the tape advancing rollers 95, 95 are rotated to advance the peeled protective tape 27 to the take-up roller 96 at a predetermined speed. At the same time, the take-up roller 96 in contact with the protective tape 27 is rotated, whereby the peeled protective tape 27 is wound around the take-up roller 96.

Simultaneously with starting of winding the protective tape 27, the chucking mechanism 93 starts to move toward the take-up roller 96. When the protective tape 27 is wound around the take-up roller 96 to some extent, the chucking members 91, 91 release the projecting end portion 52, whereby the take-up roller 96 is allowed to continue winding of the protective tape 27 around itself. The tape advancing rollers 95, 95 rotate at a rotational speed which is synchronized with the rotational speed of the wafer W such that the angle between the protective tape 27 peeled from the wafer W and the tangential direction of the wafer W is 90°.

The take-up roller 96 and the tape advancing rollers 95, 95 continue rotating until the entirety of the protective tape 27 is peeled from the peripheral portion of the wafer W and is wound around the take-up roller 96. Although not shown in FIG. 21B, the tape advancing rollers 95, 95 and the take-up roller 96 are rotated by the motors 97, 99, respectively. After the winding of the protective tape 27 is terminated, the take-up roller 96 moves backward and the tape advancing rollers 95, 95 move in the directions away from each other.

Figure 22:
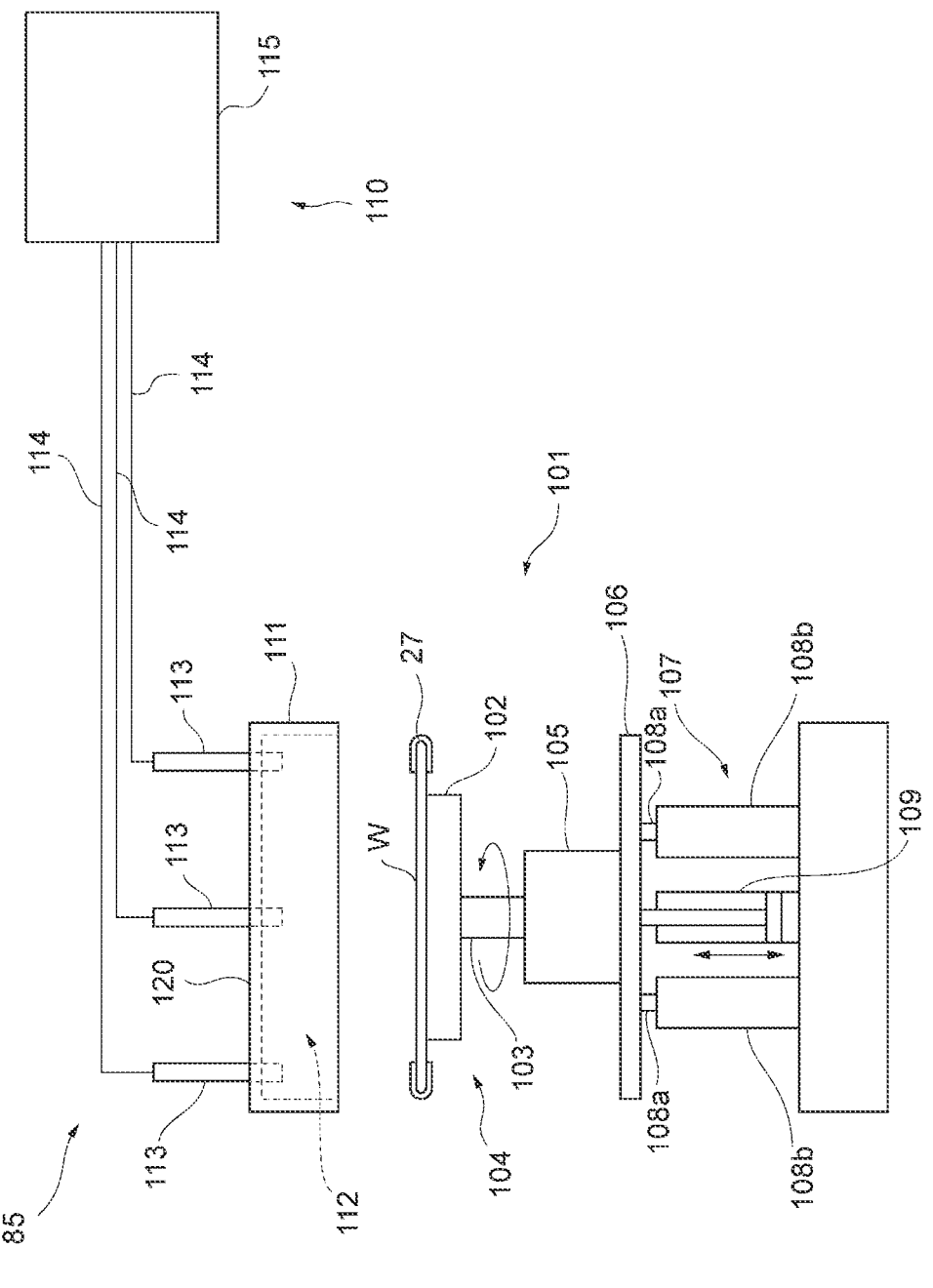
FIG. 22 is a schematic view showing a UV irradiation module.

FIG. 22 is a schematic view showing the UV irradiation module 85. The UV irradiation module 85 includes a substrate holder 101 for UV irradiation for holding the wafer W, a UV irradiation unit 110 for irradiating ultraviolet rays to the protective tape 27 stuck on the peripheral portion of the wafer W, and a cup-shaped light-shielding cover 111 coupled to the UV irradiation unit 110.

The substrate holder 101 for UV irradiation includes a substrate holding device 104 for holding and rotating the substrate, and an elevating mechanism 107 for moving the substrate holding device 104 up and down. The substrate holding device 104 has a substrate stage 102 for holding the wafer W horizontally, a shaft 103 secured to a center of a lower surface of the substrate stage 102, and a stage motor 88 for rotating the shaft 103 and the substrate stage 102. The substrate stage 102 is coupled to a vacuum source, which is not shown in the drawings, so that the wafer W can be held to an upper surface of the substrate stage 102 (i.e., substrate holding surface) by vacuum suction force generated by the vacuum source. When the stage motor 105 is set in motion, the shaft 103 rotates in a direction of arrow illustrated in the drawing, and the substrate stage 102 and the wafer W placed on the substrate stage 102 rotate in accordance with the rotation of the shaft 103.

Figure 23:
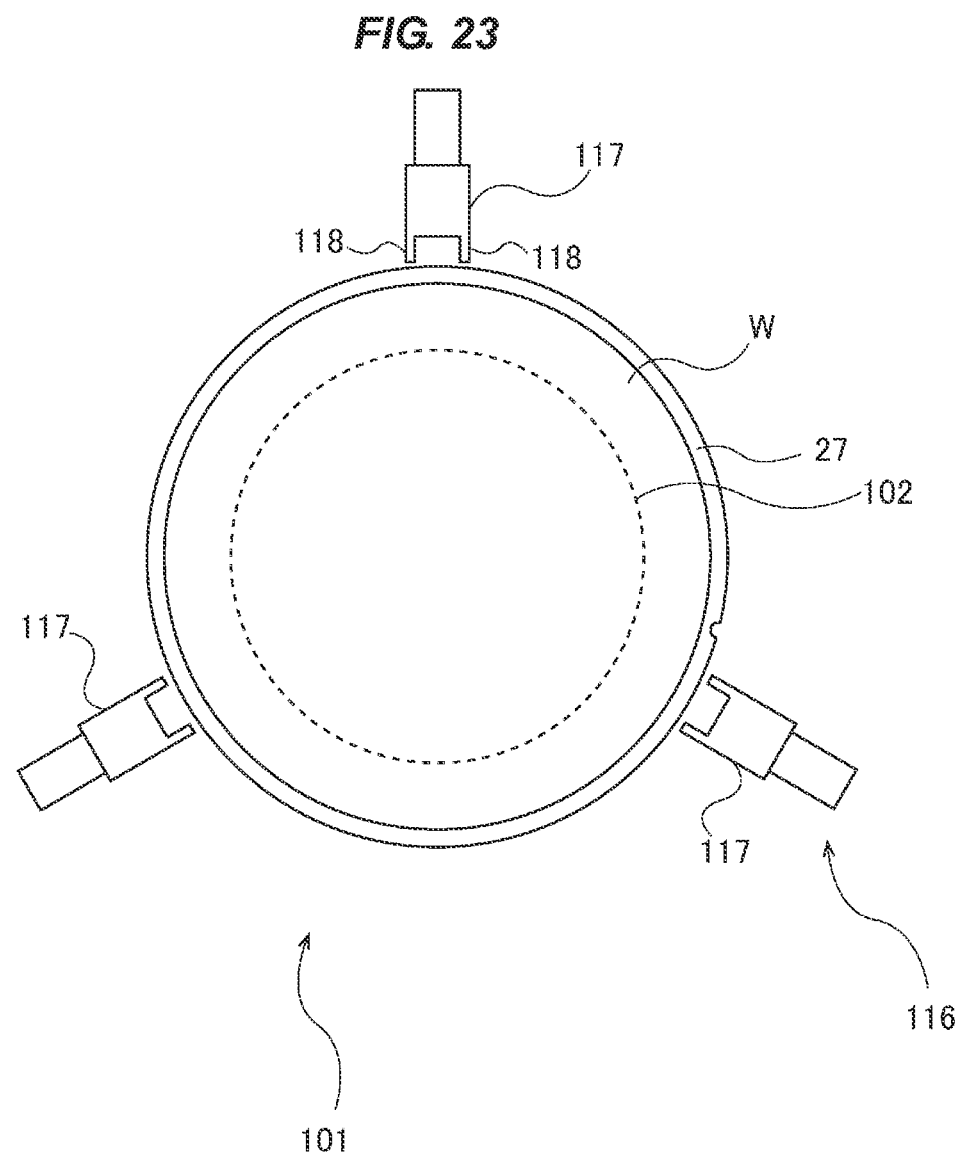

As shown in FIG. 23, the substrate holder 101 for UV irradiation includes a centering mechanism 116 for centering the wafer W before holding the wafer W to the substrate stage 102 by the vacuum suction. The centering mechanism 116 includes a plurality of (e.g., three as illustrated) centering fingers 117 arranged at equal intervals along a circumferential direction of the wafer W. Each centering finger 117 has, at its front end, two projecting portions (finger portions) 118 capable of touching the peripheral portion of the wafer W. The configuration of centering finger 117 is the same as that of centering finger 32.

As shown in FIG. 22, the elevating mechanism 107 is coupled to the substrate holding device 104. The elevating mechanism 107 includes a moving mechanism 109 composed of an air cylinder and the like, a plurality of guide rods 108*a*, a plurality of linear guides 108*b*, and a base 106. The stage motor 105 of the substrate holding device 104 is secured to the base 106, and each guide rod 108*a* is coupled to the base 106. Each guide rod 108*a* is supported by each linear guide 108*b* with low friction so as to be vertically movable.

The moving mechanism 109 is composed of an air cylinder and the like. When the moving mechanism 109 is operated, the base 106 and the substrate holding device 104 secured to the base 106 are moved in the vertical direction. In this embodiment, the substrate holding device 104 can be moved up and down by regulating air pressure of the moving mechanism 109 which is composed of an air cylinder and the like. In one embodiment, the movement mechanism 109 may be composed of a combination of a servo motor, a ball screw mechanism, and a motor driver.

The UV irradiation unit 110 includes a UV generator 115 having a light source generating ultraviolet rays, a plurality of irradiation heads 113 for emitting (irradiating) ultraviolet rays generated by the UV generator 115, and a plurality of fiber cables 114 for transmitting ultraviolet rays generated by the UV generator 113 to the irradiation heads 113. One end of each fiber cable 114 is coupled to each irradiation head 113, and the other end is coupled to the UV generator 115. The irradiation head 113 is coupled to the light-shielding cover 111. When the UV generator 115 is operated, the UV generator 115 generates ultraviolet rays, and then the ultraviolet rays are transmitted to the irradiation head 113 through the fiber cable 114, causing the irradiation head 113 to emit the ultraviolet rays.

Figure 24:
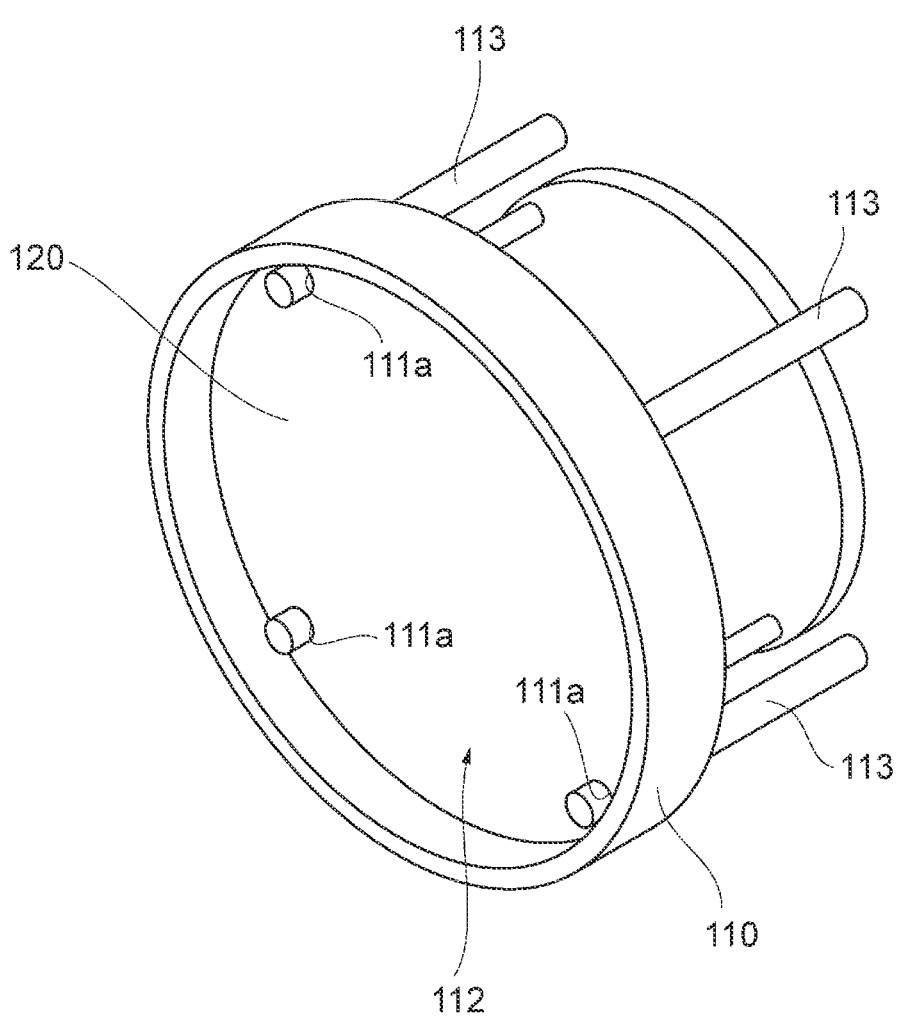
FIG. 24 is a perspective view showing a light-shielding cover.

The light-shielding cover 111 is disposed above the substrate holding device 104, and opens downward. FIG. 24 is a perspective view showing the light-shielding cover 111. An inner diameter of the light-shielding cover 111 is larger than a diameter of the wafer W, and the light-shielding cover 111 is formed so as to be able to cover the wafer W in its entirety. The plurality of irradiation heads 113 extend into an inner space 112 of the light-shielding cover 111 through the plurality of through-holes 111*a* formed in an upper wall 120 of the light-shielding cover 111. With this structure, the UV irradiation unit 110 can irradiate ultraviolet rays into the inner space 112. Specifically, the plurality of through-holes 111*a* and the plurality of irradiation heads 113 are arranged along a circumferential direction of the upper wall 120.

Figure 25:
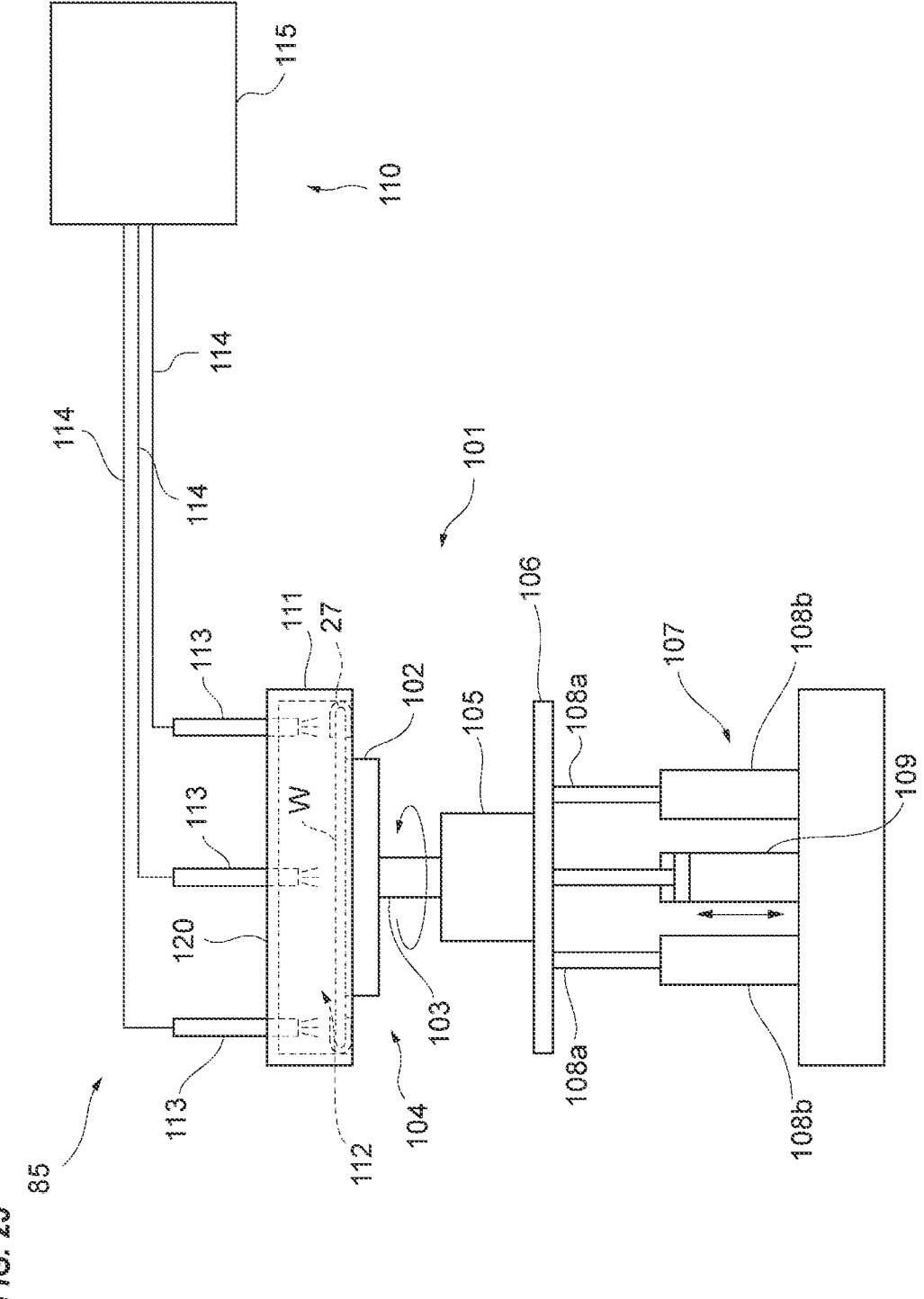
FIG. 25 is a schematic view showing a state in which the wafer is located into an inner space of the light-shielding cover.

As shown in FIG. 25, when, with the wafer W held to the substrate stage 102, the substrate holding device 104 is moved up, the wafer W in its entirety is located into the inner space 112 of the light-shielding cover 111. As a result, the wafer W is covered by the light-shielding cover 111. The plurality of irradiation heads 113 are arranged in a position where, when the wafer W is located in the inner space 112, ultraviolet rays can be irradiated onto the protective tape 27 stuck on the wafer W.

With the wafer W located in the inner space 112, ultraviolet rays are irradiated from the irradiation head 113 to the protective tape 27. In other words, the UV irradiation module 85 irradiates ultraviolet rays from the irradiation head 113 to the protective tape 27 while covering the wafer W in its entirety with the light-shielding cover 111.

Irradiating ultraviolet rays to the protective tape 27 having the UV-curable adhesive layer causes the adhesive layer to be cured, resulting in peeling off the protective tape 27 more easily. As a result, it is possible to reduce a time required to peel off the protective tape, and to prevent a part of the adhesive of the protective tape from remaining on the wafer after the tape is peeled off (adhesive residue). In this embodiment, ultraviolet rays are irradiated from the irradiation heads 113 to the protective tape 27 while covering the wafer W in its entirety with the light-shielding cover 111, thereby enabling efficient irradiation of ultraviolet rays. Therefore, the adhesive layer can be cured in a shorter time.

In this embodiment, with the wafer W located in the inner space 112, the wafer W is rotated around its axis by the stage motor 105 of the substrate holding device 104. The UV irradiation unit 110 irradiates ultraviolet rays to the protective tape 27 stuck on the rotating wafer W. This operation enables ultraviolet rays to be irradiated more efficiently. Therefore, UV-curable adhesive layer can be cured in a shorter time.

In this embodiment, the UV irradiation unit 110 has the plurality of irradiation heads 113. However, the number of irradiation heads 113 may be one. Further, in one embodiment, it is not necessary for the tip of the irradiation head 113 to be located in the inner space 112, as long as the irradiation head 113 is configured to irradiate ultraviolet rays into the inner space 112 through the through-hole 111*a*. For example, the irradiation head 113 may be arranged such that the tip of the irradiation head 113 may be located within the through-hole 111*a*.

Further, in one embodiment, the UV irradiation unit 110 may be composed of a UV lamp having a light source for generating ultraviolet rays. In this case, the UV irradiation unit 110 is disposed in the inner space 112, and is arranged at a position where, when the wafer W on which the protective tape 27 is stuck is located in the inner space 112, ultraviolet rays can be irradiated to the protective tape 27. Further, in one embodiment, the UV irradiation module 85 may have a plurality of UV irradiation units 110, each of which is composed of a UV lamp having a light source for generating ultraviolet rays. The plurality of UV irradiation units 110 may be arranged along a circumferential direction of the upper wall 120 and within the inner space 112.

Further, in one embodiment, the UV irradiation module 85 may be composed of a UV lamp having a light source for generating ultraviolet rays. The UV lamp is disposed at a position capable of irradiating ultraviolet rays to the protective tape 27, such as in the vicinity of the substrate stage 22, and the protective tape 27 is peeled off while irradiating ultraviolet rays to the protective tape 27, whereby the speed of peeling off the protective tape 27 can be increased, and the adhesive residue can be prevented.

Further, in one embodiment, the tape peeling module 81 may include a dryer for warming the protective tape 27. In a case where the adhesive layer of the protective tape 27 has an adhesive property that decreases in adhesive strength as the temperature increases, warming of the protective tape 27 causes the adhesive strength of the adhesive layer to be decreased, thereby enabling the protective tape 27 to be peeled off easily. Peeling off the protective tape 27 while warming the protective tape 27 with the dryer causes the speed of peeling off the protective tape 27 to be increased, thereby preventing adhesive residue.

Figure 26:
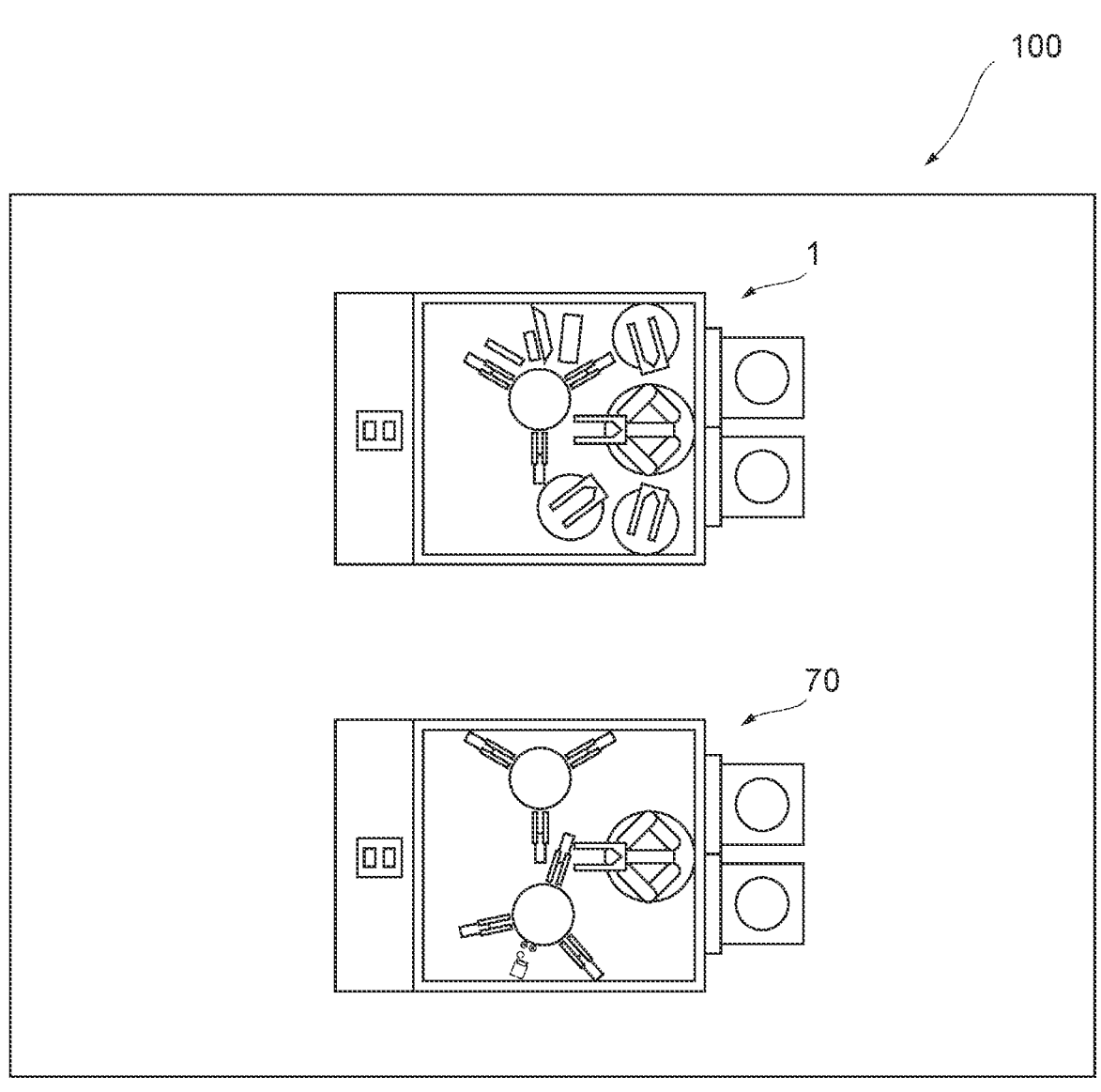
FIG. 26 is a schematic view showing a tape processing system according to one embodiment.

FIG. 26 is a schematic view showing an embodiment of a tape processing system having the tape sticking system 1 and the tape peeling system 70. The tape sticking system 1 and the tape peeling system 70 are disposed in the tape processing system 100 as shown in FIG. 26. The tape sticking system 1 and the tape peeling system 70 are arranged side by side in a horizontal direction.

Next, a tape sticking method according to an embodiment will be described. In this specification, a tape sticking method is defined as a method including a tape sticking process, a heating process, and a tape peeling process, which are described below, and a tape peeling process is defined as a method including a rotary peeling process, and a UV irradiation process, which are described below. At first, the tape sticking process will be described. First, the transfer robot 13 transfers the wafer W from the load port 5 to the tape sticking module 20, and places the wafer W on the substrate stage 22 of the substrate holder 21 for sticking. The substrate holder 21 for sticking holds the wafer W in a rotatable manner. Next, as shown in FIGS. 8A through 8C, the tape holding head 40 sticks the beginning of the protective tape 27 on the peripheral side surface of the wafer W. Next, the positioning roller 42 and the side roller 43 are moved toward the wafer W until the side roller 43 comes into contact with the peripheral side surface of the wafer W, and then the side roller 43 presses the protective tape 27 against the peripheral side surface of the wafer W with a predetermined force. Then, with the beginning of the protective tape 27 stuck on the peripheral side surface, the nipping mechanism 60 moves the first roller 46 and the second roller 47 in the direction closer to each other, so that the rollers 46, 47 cause the wafer W to be nipped with a desired force. Further, the roller-driving motor 49 is set in motion while nipping the wafer W with the rollers 46, 47. As a result, the wafer W is rotated about its axis.

As the wafer W rotates, the protective tape 27 reaches the first roller 46 and the second roller 47. The protective tape 27, which has been bent by the side roller 43, is nipped with a predetermined force by the first roller 46 and the second roller 47. The upper half of the protective tape 27 is bent by the first roller 46 along the longitudinal direction of the protective tape 27 and pressed against the upper surface (the first surface) of the peripheral portion of the wafer W. At the same time, the lower half of the protective tape 27 is bent by the second roller 47 along the longitudinal direction of the protective tape 27 and pressed against the lower surface (the second surface) of the peripheral portion of the wafer W. The protective tape 27 is stuck on the peripheral portion of the wafer W in this manner. Further, by making one rotation of the wafer W, the protective tape 27 is stuck on the entire peripheral portion of the wafer W. Thereafter, the protective tape 27 is cut by the tape cutter 50, and further the wafer W is rotated to form the projecting end portion 52.

Next, the wafer W, on which the protective tape 27 has been stuck, is taken out from the substrate holder 21 for sticking by the transfer robot 13, and then the heating process is performed. The transfer robot 13 transfers the wafer W, on which the protective tape 27 has been stuck, to the tape heating apparatus 15, and places it on the heating stage 15a. As a result, the wafer W is heated in the tape heating apparatus 15.

After completion of the heating process, the wafer W is taken out of the tape heating apparatus 15 and transferred to the load port 5. Thereafter, various types of processing, such as wet processing for example plating, and/or dry processing for example dry etching, are performed to the wafer W. After completion of the processing to the wafer W, the wafer W is transferred to the tape peeling system 70, where the tape peeling process is performed.

Next, a tape peeling process according to one embodiment will be described below. In this embodiment, the peeling process of the protective tape 27 having the UV-curable adhesive layer is described. First, the UV irradiation process is performed. In the UV irradiation process, the wafer W is transferred by the transfer robot 73 from the load port 75 to the UV irradiation module 85 by the transfer robot 73, and placed to the substrate stage 102 of the substrate holder 101 for UV irradiation. Then, the moving mechanism 109 is operated to move up the substrate holding device 104. When the substrate holding device 104 is moved up until the wafer W is located in the inner space 112 of the light-shielding cover 111, the moving mechanism 109 is stopped.

With the wafer W located in the inner space 112 of the light-shielding cover 111, the UV irradiation unit 110 irradiates ultraviolet rays from the irradiation head 113 to the wafer W. The UV irradiation system 110 irradiates ultraviolet rays to the protective tape 27 stuck on the wafer W while covering the wafer W in its entirety with the light-shielding cover 111. At this time, the wafer W is rotated by the stage motor 105 of the substrate holding device 104. The UV irradiation module 85 irradiates ultraviolet rays to the protective tape 27 while rotating the wafer W and covering the wafer W in its entirety with the light-shielding cover 111.

After irradiating ultraviolet rays for a predetermined period of time, the UV irradiation unit 110 and the stage motor 105 are stopped. Then, the moving mechanism 109 is operated to move down the substrate holding device 104. Then, the wafer W is taken out from the substrate holder 101 for UV irradiation by the transfer robot 73, and the rotational peeling process is performed. The rotational peeling process is a process to peel the protective tape from the peripheral portion of the wafer W while rotating the wafer W. In the rotational peeling process, the wafer W is first transferred to the tape peeling module 81 by the transfer robot 73, and placed on the substrate stage 86 of the substrate holder 83 for peeling. Then, as described with reference to FIGS. 20, 21A, and 21B, the tape peeling unit 90 and the substrate holder 83 for peeling are operated to peel the protective tape from the wafer W. After completion of peeling the protective tape 27, the tape peeling unit 90 and the substrate holder 83 for peeling are stopped. Thereafter, the transfer robot 73 takes out the substrate from the substrate holder 83 for peeling, and transfers the wafer W to the load port 75.

Figure 27:
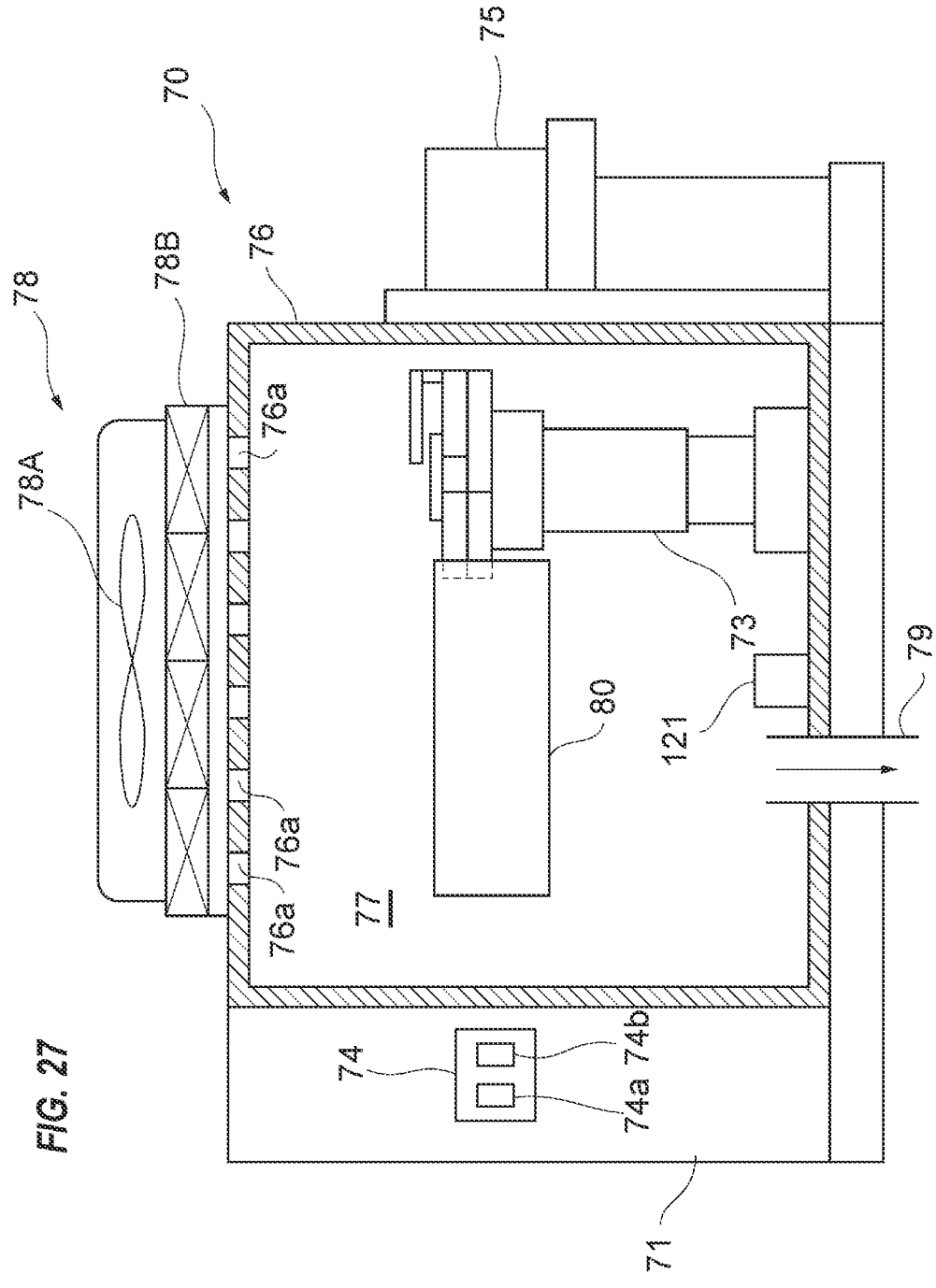
FIG. 27 is a schematic view of a tape peeling system according to another embodiment.

FIG. 27 is a schematic view of the tape peeling system 70 according to another embodiment. As shown in FIG. 27, a disposal box 121 for discarding the protective tape 27 that has been peeled off may be provided below the tape peeling device 80. Provision of such disposal box 121 enables the peeled protective tape 27 to be discarded efficiently.

In this embodiment, the tape processing system 100 includes the tape sticking system 1 and the tape peeling system 70. However, in one embodiment, the tape sticking system 1 may have the tape peeling system 80. In this case, the tape sticking apparatus 10 and the tape peeling apparatus 80 may be arranged horizontally side by side, or the tape peeling apparatus 80 may be disposed below the tape sticking apparatus 10. In the case where the tape sticking system 1 includes the tape peeling device 80, the transfer robot 13 transfers the wafer W between the tape sticking apparatus 10 and the tape peeling apparatus 80. Further, the transfer robot 13 transfers the wafer W between the tape peeling module 81 and the UV irradiation module 85. Arranging the tape sticking apparatus 10 above the tape peeling apparatus 80 makes it possible to stick the protective tape 27 without contaminating the surface of the wafer W. Arranging the tape peeling apparatus 80 below the tape sticking apparatus 10 makes it possible to easily discard the peeled protective tape 27.

Figure 28:
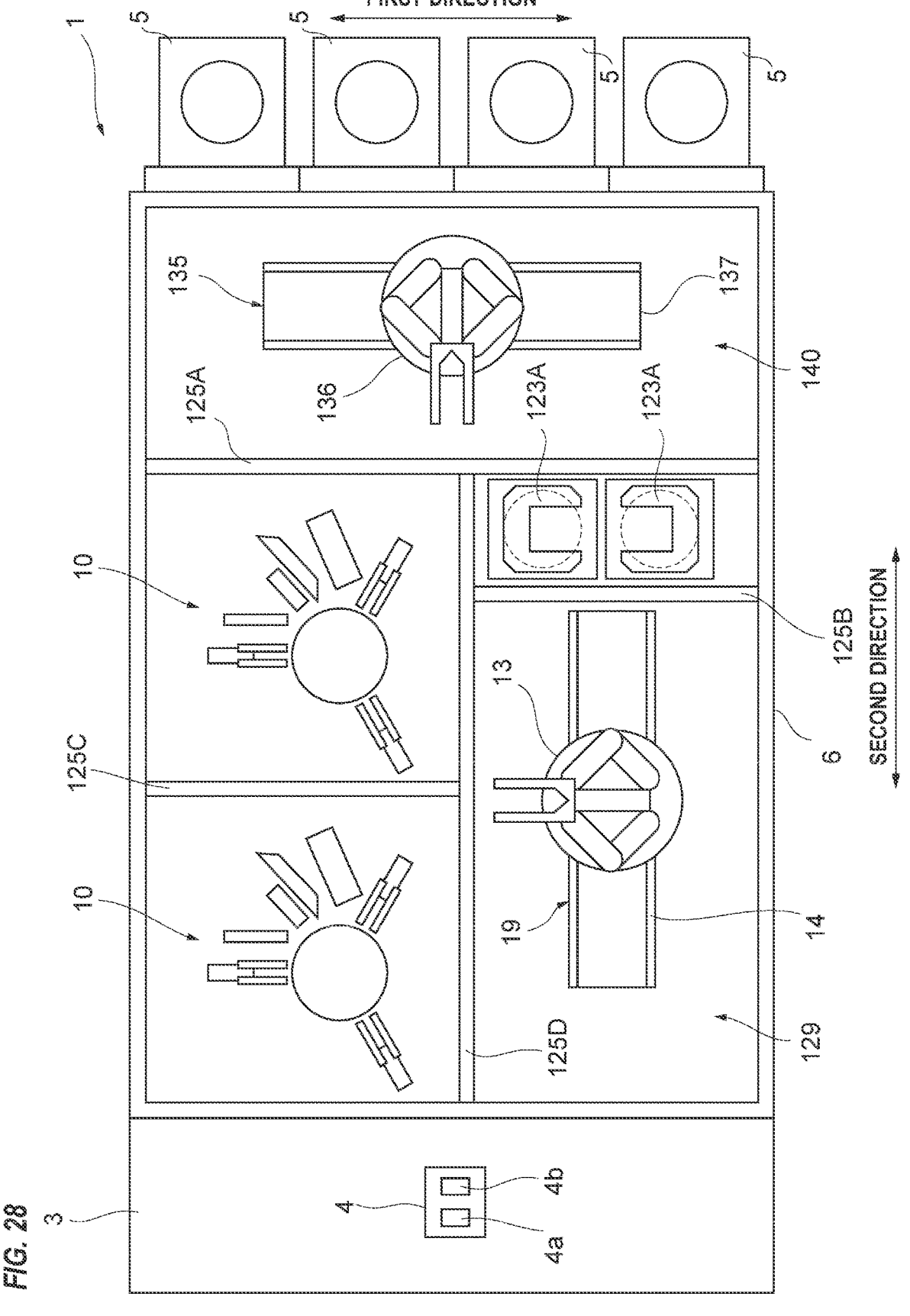
FIG. 28 is a plan view schematically showing the tape sticking system according to another embodiment.
Figure 29:
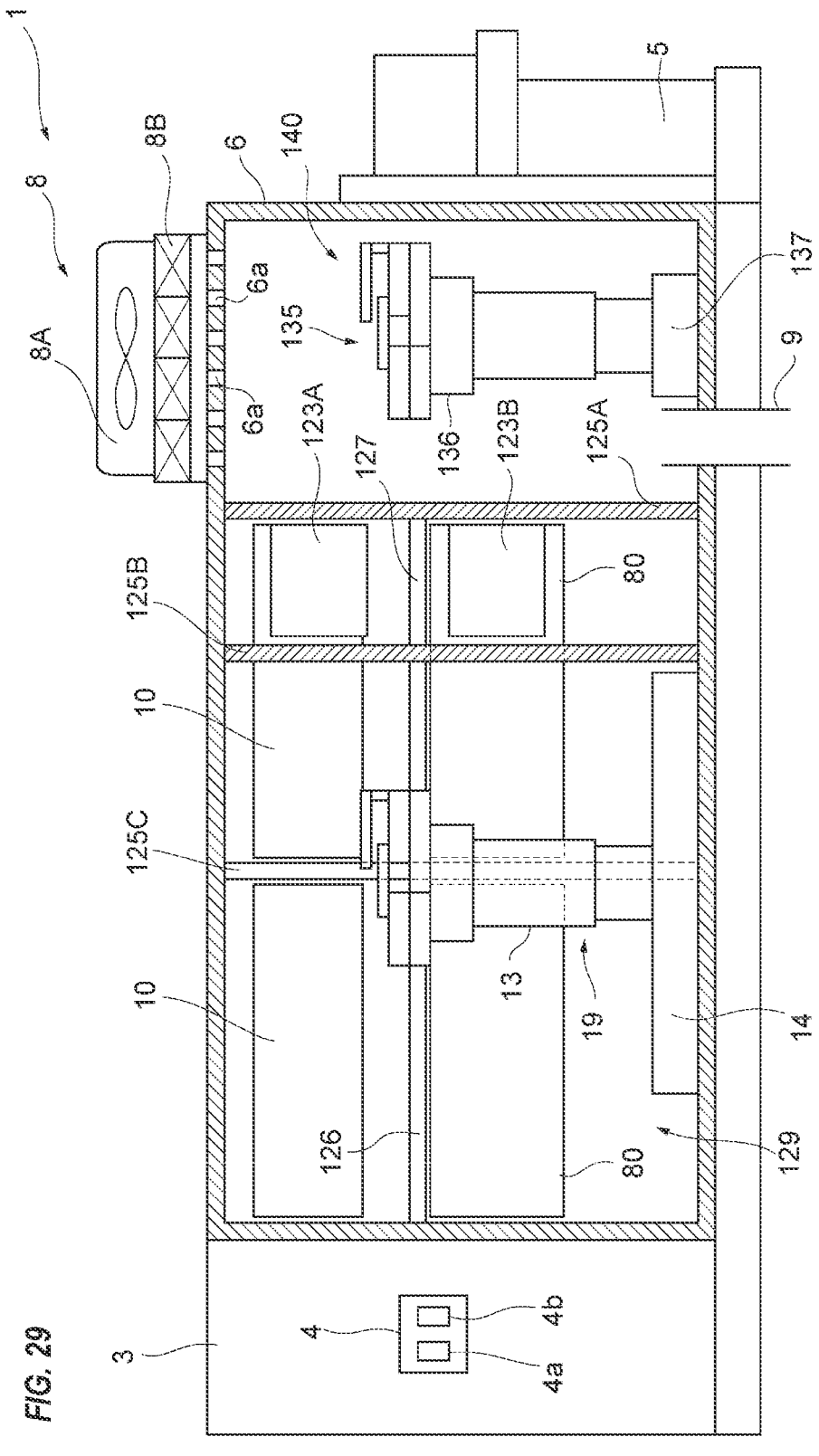
FIG. 29 is a side view schematically showing the tape sticking system shown in FIG. 28.

FIG. 28 is a plan view schematically showing the tape sticking system according to another embodiment, and FIG. 29 is a side view schematically showing the tape sticking system 1 shown in FIG. 28. Details of this embodiment, which will not be particularly described, are the same as those of the embodiments described with reference to FIGS. 3 through 27, and thus duplicate descriptions thereof will be omitted. As shown in FIGS. 28 and 29, the tape sticking system 1 according to this embodiment further includes a plurality of tape peeling devices 80, a linear guide 14 for holding the transfer robot 13 movably, a plurality of temporary stages 123A, 123B for temporarily placing the wafer W, and a substrate transfer system 135 for transferring the wafer W between the load port 5 and the temporary stages 123A, 123B. The tape sticking system 1 according to this embodiment includes the plurality of tape sticking apparatuses 10. In this embodiment, the transfer robot 13 and linear guide 14 constitute a transfer device 19. More specifically, the tape sticking system 1 of this embodiment has two tape sticking apparatuses 10 and two tape peeling apparatuses 80.

The substrate transfer system 135 includes a transfer robot 136 for transferring the wafer W between the load port 5 and the temporary stages 123A, 123B, and a linear guide 137 for holding the transfer robot 136 movably. Examples of the substrate transfer system 135 include an EFEM (Equipment Front End Module). In one embodiment, the transfer robot 136 may include a Bernoulli hand having a configuration similar to the Bernoulli hand 16 described with reference to FIG. 15. The tape sticking apparatuses 10, the tape peeling apparatuses 80, the transfer robot 13, the linear guide 14, the temporary stages 123A, 123B, and the substrate transfer system 135 are disposed within the partition wall 6.

Hereinafter, in this specification, a direction in which the plurality of load ports 5 are arranged is defined as a first direction, and a direction perpendicular to the first direction, when viewed from above, is defined as a second direction. Hereinafter, in this specification, a direction perpendicular to both the first direction and the second direction is defined as a vertical direction. Further, in this specification, the first direction and the second direction may be collectively referred to as a horizontal direction. Further, in this specification, the tape sticking apparatus 10 and the tape peeling apparatus 80 may be collectively referred to as the tape processing apparatuses 10, 80, respectively.

The linear guide 137 extends in the first direction, and transfer robot 136 is configured to be movable in the first direction. The linear guide 14 extends in the second direction, and the transfer robot 136 is configured to be movable in the second direction.

In this embodiment, an interior of the partition wall 6 is divided into a process area 129 and an EMEF area 140. The tape sticking apparatuses 10, the tape peeling apparatuses 80, the transfer robot 13, the linear guides 14, and temporary stages 123A, 123B are arranged in the process area 129, and the substrate transfer system 135 is arranged in the EMEF area 140. The transfer robot 136 is configured to be accessible to the load port 5 and the temporary stages 123A, 123B.

The transfer robot 13 is located in a central portion of the process area 129, and is configured to be accessible to the tape sticking apparatuses 10, the tape peeling apparatuses 80, and the temporary stages 123A, 123B. The transfer robot 13 is configured to transfer the wafer between the tape sticking apparatuses 10, the tape peeling apparatuses 80, and the temporary stages 123A, 123B.

The tape sticking system 1 has a dividing wall 125A for dividing the interior of the partition wall 6 into the process area 129 and the EMEF area 140. The dividing wall 125A is disposed between the tape processing apparatuses 10, 80 and the substrate transfer system 135, and between the temporary stages 123A, 123B and the substrate transfer system 135. The dividing wall 125A extends in the first direction and in the vertical direction.

Specifically, the process area 129 is an area surrounded by the partition wall 6 and the dividing wall 125A. The EMEF area 140 is an area surrounded by the partition wall 6 and the dividing wall 125A. The partition wall 125A has a door, which is not shown in the drawings, and the wafer can be carried into the temporary stages 123A, 123B through this door, and carried out from the temporary stages 123A, 123B through the door.

Figure 30:
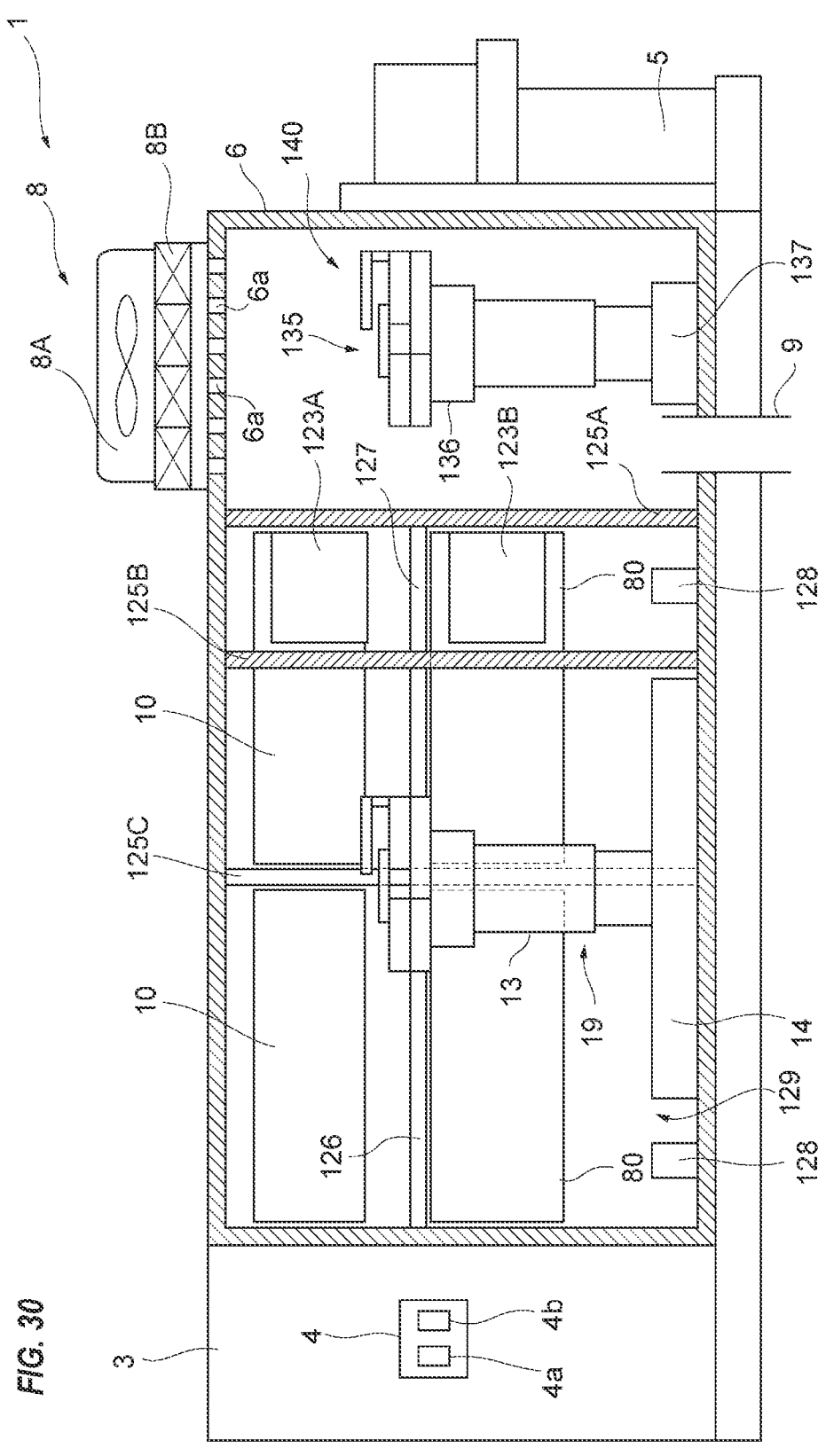
FIG. 30 is a side view schematically showing the tape sticking system according to another embodiment.

In this embodiment, the plurality of tape sticking apparatuses 10 are arranged side by side in the horizontal direction (the second direction). Similarly, the plurality of tape peeling apparatuses 80 are arranged side by side in the horizontal direction (the second direction). The plurality of tape peeling apparatuses 80 are arranged below the plurality of tape sticking apparatuses 10. More specifically, each tape peeling apparatus 80 is arranged below each tape sticking apparatus 10. This arrangement enables the protective tape 27 to be stuck without contaminating the surface of the wafer W, and the peeled off protective tape 27 to be easily discarded. In one embodiment, as shown in FIG. 30, a plurality of disposal boxes 128 for discarding the peeled protective tape 27 may be provided below the plurality of tape peeling apparatuses 80.

The temporary stages 123A, 123B are disposed between the transfer device 19 and the substrate transfer system 135, and the temporary stage 123B is arranged below the temporary stage 123A. In one embodiment, the temporary stage 123A may be used exclusively for wafers to stick the protective tape 27, and the temporary stage 123B may be used exclusively for wafers to peel off the protective tape 27. In one embodiment, the temporary stages 123A, 123B may be arranged vertically side by side.

In this embodiment, four load ports 5 are provided. With this configuration, it is possible to use them in different ways depending on the type of wafer. For example, two load ports 5 at a side of the tape sticking apparatuses 10 in the first direction are used exclusively for the wafers to stick the protective tape 27, and the other two are used exclusively for the wafers to peel the protective tape 27. Such configuration enables contamination at the edge of the wafer in the cassette (hoop) to be prevented. In particular, by separating the wafers before sticking the protective tape 27 or plating, and the wafers after plating or peeling the protective tape 27, metal contamination on the wafer edge and on the back surface of the wafer can be prevented.

The tape sticking system 1 according to this embodiment further includes a dividing wall 125B arranged between the temporary stages 123A, 123B and the transfer device 19, a dividing wall 125C arranged between the tape processing apparatuses 10, 80 which are arranged side by side horizontally (between the plurality of tape sticking apparatuses 10 arranged side by side in the horizontal direction, and between the plurality of tape peeling apparatuses 80 arranged side by side in the horizontal direction), a dividing wall 125D arranged between the tape processing apparatuses 10, 80 and the transfer device 19, and between the tape processing apparatuses 10, 80 and the temporary stages 123A, 123B, a dividing wall 126 arranged between the tape sticking apparatus 10 and the tape peeling apparatus 80, and a dividing wall 127 arranged between the temporary stage 123A and the temporary stage 123B.

The dividing walls 125B, 125C extend in the first direction and the vertical direction, and the dividing wall 125D extends in the second direction and the vertical direction. The dividing walls 126, 127 extend in the horizontal direction. The dividing wall 125C extends through the dividing wall 126.

These dividing walls 125A, 125B, 125C, 125D, 126 divide areas where each tape processing unit 10, 80 is installed. The dividing walls 125B, 125D are provided with doors, which are not shown in the drawings, respectively. The wafer can be carried into each of the tape processing apparatuses 10, 80 through these doors, and carried out from each of the tape processing apparatuses 10, 80 through these doors.

In this manner, the areas where each of the tape processing apparatuses 10, 80 (each of the tape sticking apparatuses 10 or each of the tape peeling apparatuses 80) are arranged are divided into different sections, and the access surfaces for an operator are provided on the side surfaces of the apparatuses (the partition wall 6), so that consumables (for example, the protective tape, and the UV lamp) can be replaced in each of the tape processing apparatuses 10, 80, and each of the tape processing apparatuses 10, 80 can be individually shut down in the event of a failure. Thus, it is possible to make use of the tape processing apparatuses 10, 80 that are normally operable, and to reduce downtime of the tape processing apparatuses 10, 80. As a result, the tape sticking process and the tape peeling processes can be performed continuously without reducing processing capacity. Further, provision of the dividing wall 127 between the temporary stage 123A and the temporary stage 123B enables a movement of contaminants between the temporary stage 123A and the temporary stage 123B to be prevented.

Figure 31:
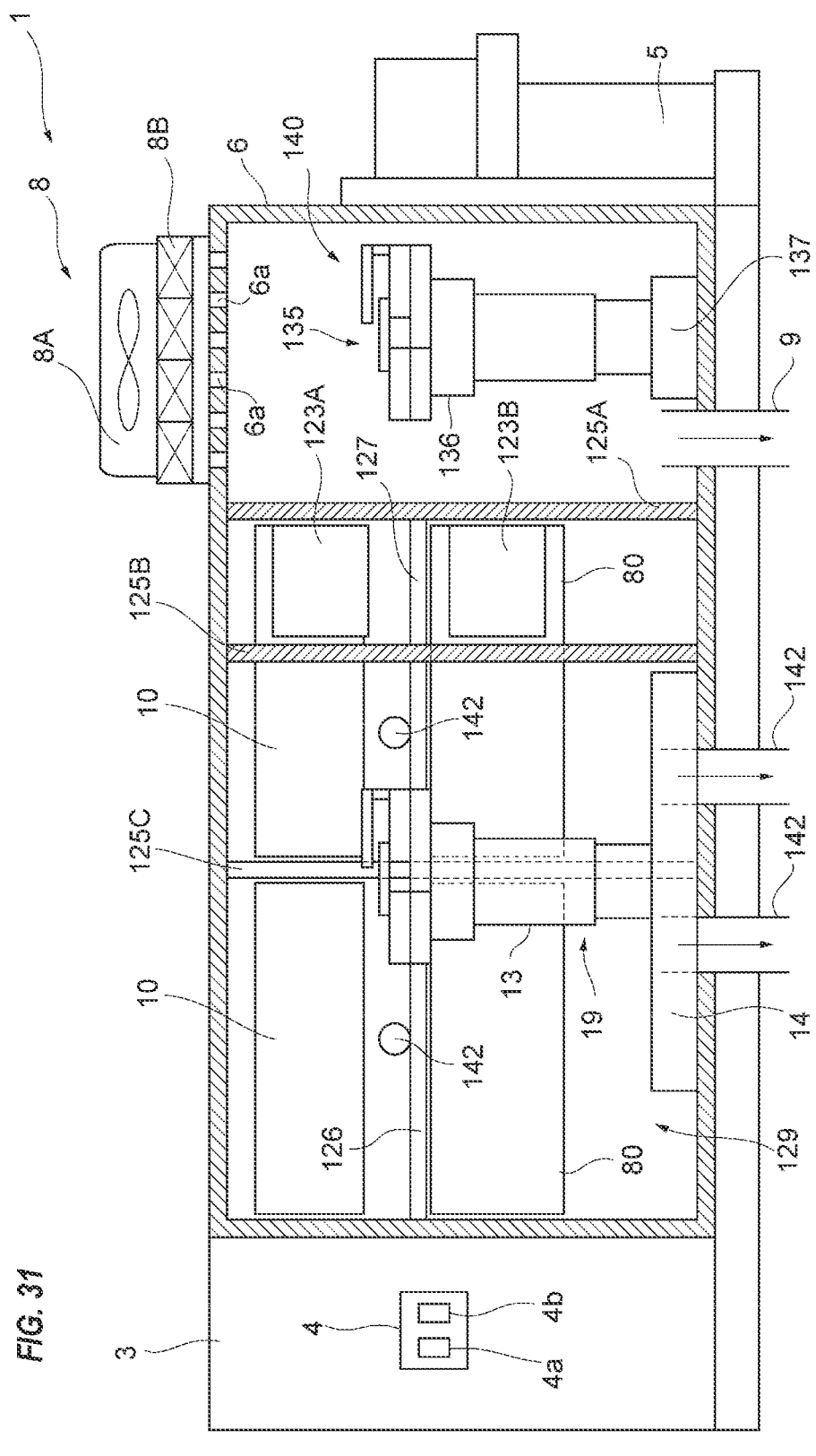
FIG. 31 is a side view schematically showing the tape sticking system according to another embodiment.

As shown in FIG. 31, the tape sticking system 1 may further include a plurality of local exhaust ventilations 142. The dividing walls 125A, 125B, 125C, 125D, 126 are provided with air intakes, which are not shown in the drawings. In this embodiment, each local exhaust ventilation 142 is disposed below each tape processing apparatus 10, 80 (each tape sticking apparatus 10, or each tape peeling apparatus 80). Therefore, in the tape processing apparatuses 10 and 80, contamination of the surface of wafer W due to fluttering particles and adhesion of dusts to the peripheral portion of the wafer W can be prevented.

Further, in one embodiment, the dividing wall 125A may completely partition the process area 129 from the EMEF area 140. The process area 129 and the EMEF area 14 are completely partitioned, and negative pressure is generated in the process area 129 by a local exhaust system 142, thereby enabling particles generated during the tape sticking process or the tape peeling process to be prevented from moving to the EMEF area 140 or the load port 5. As a result, it is possible to stably prevent dust from adhering to the wafers over a long period of time.

Figure 32:
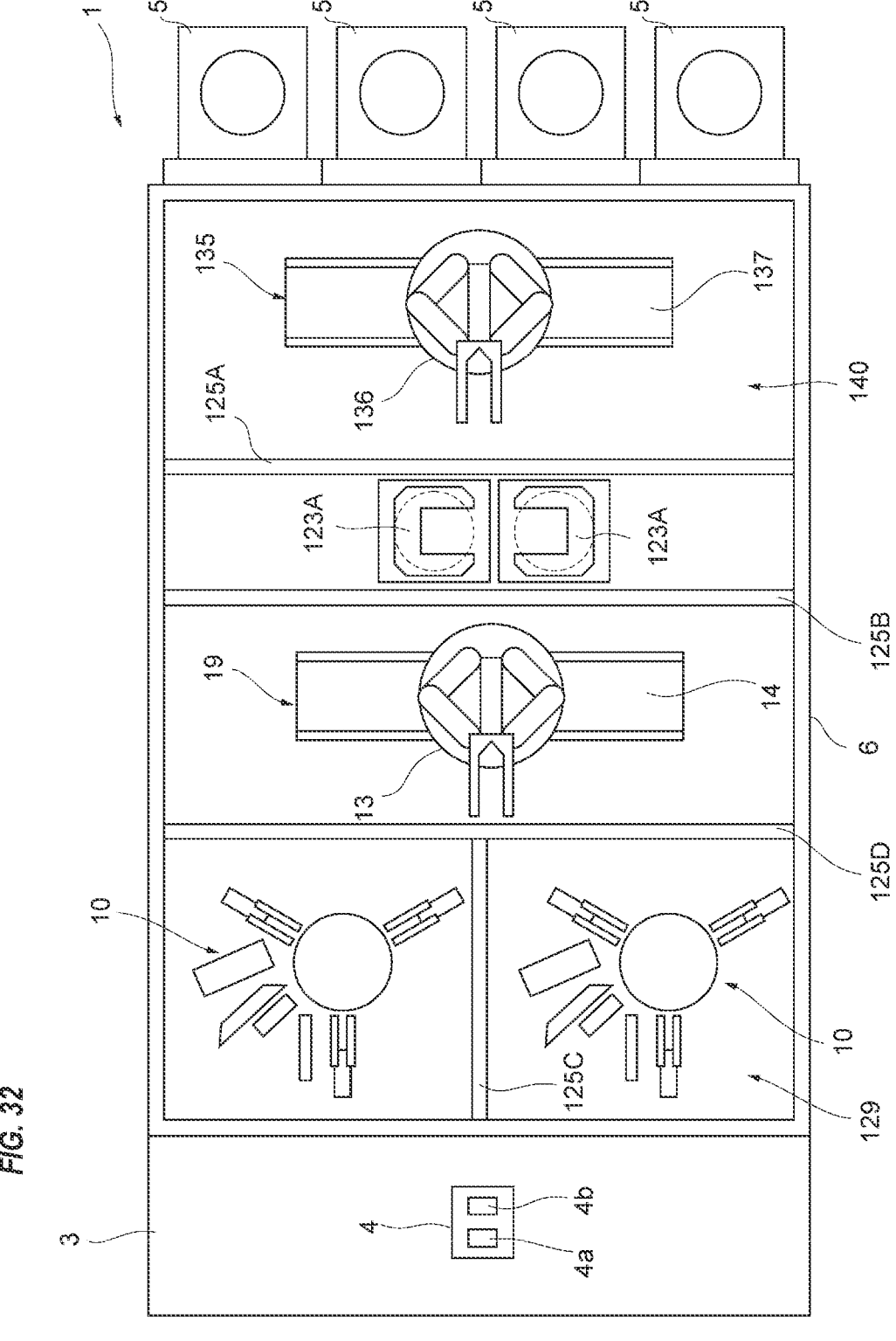
FIG. 32 is a side view schematically showing the tape sticking system according to another embodiment.
Figure 33:
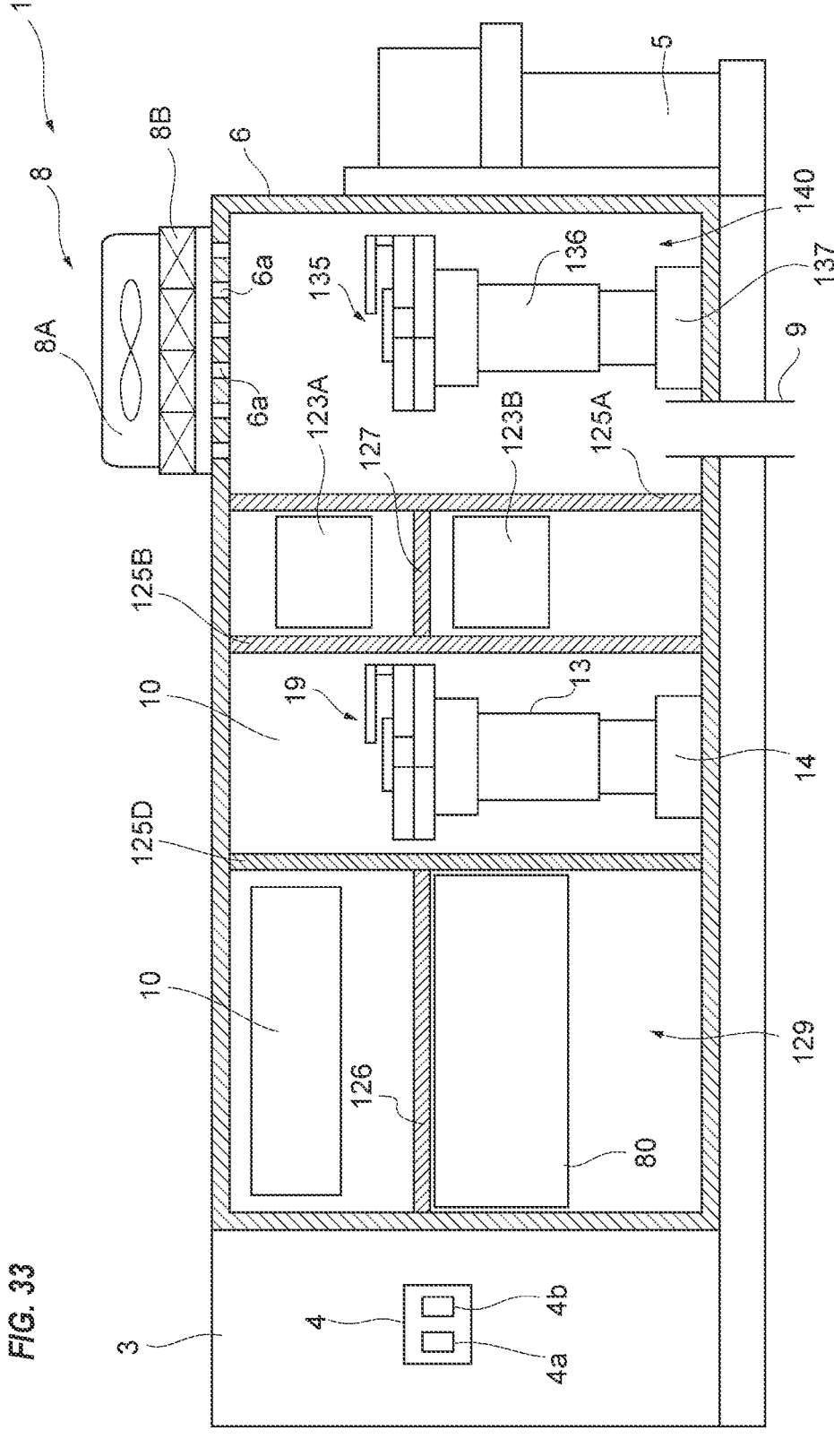
FIG. 33 is a side view schematically showing the tape sticking system shown in FIG. 32.

FIG. 32 is a plan view schematically showing the tape sticking system 1 according to another embodiment, and FIG. 33 is a side view schematically showing the tape sticking system 1 shown in FIG. 32. As shown in FIGS. 32 and 33, in this embodiment, the plurality of tape sticking apparatuses 10 are arranged side by side in the first direction. Similarly, the plurality of tape peeling apparatuses 80 are arranged side by side in the first direction. Although only one tape peeling apparatus 80 is illustrated in FIG. 33, in this embodiment, the tape sticking system 1 includes two tape peeling appliances 80, and each of the tape peeling appliances 80 is arranged below each of the tape sticking apparatuses 10. The linear guide 14 extends in the first direction, and the transfer robot 13 is configured to be movable in the first direction. The transfer device 19 is disposed between the temporary stages 123A, 123B and the tape processing apparatuses 10, 80.

In this embodiment, the dividing wall 125A is disposed between the temporary stages 123A, 123B, and the substrate transfer system 135. The dividing wall 125C extends in the second direction and in the vertical direction. The dividing wall 125D is disposed between the tape processing systems 10, 80 and the transfer system 19, and extends in the first direction and in the vertical direction. The configuration of the embodiments described with reference to FIGS. 30 and 31 can be applied to this embodiment as well.

Figure 34:
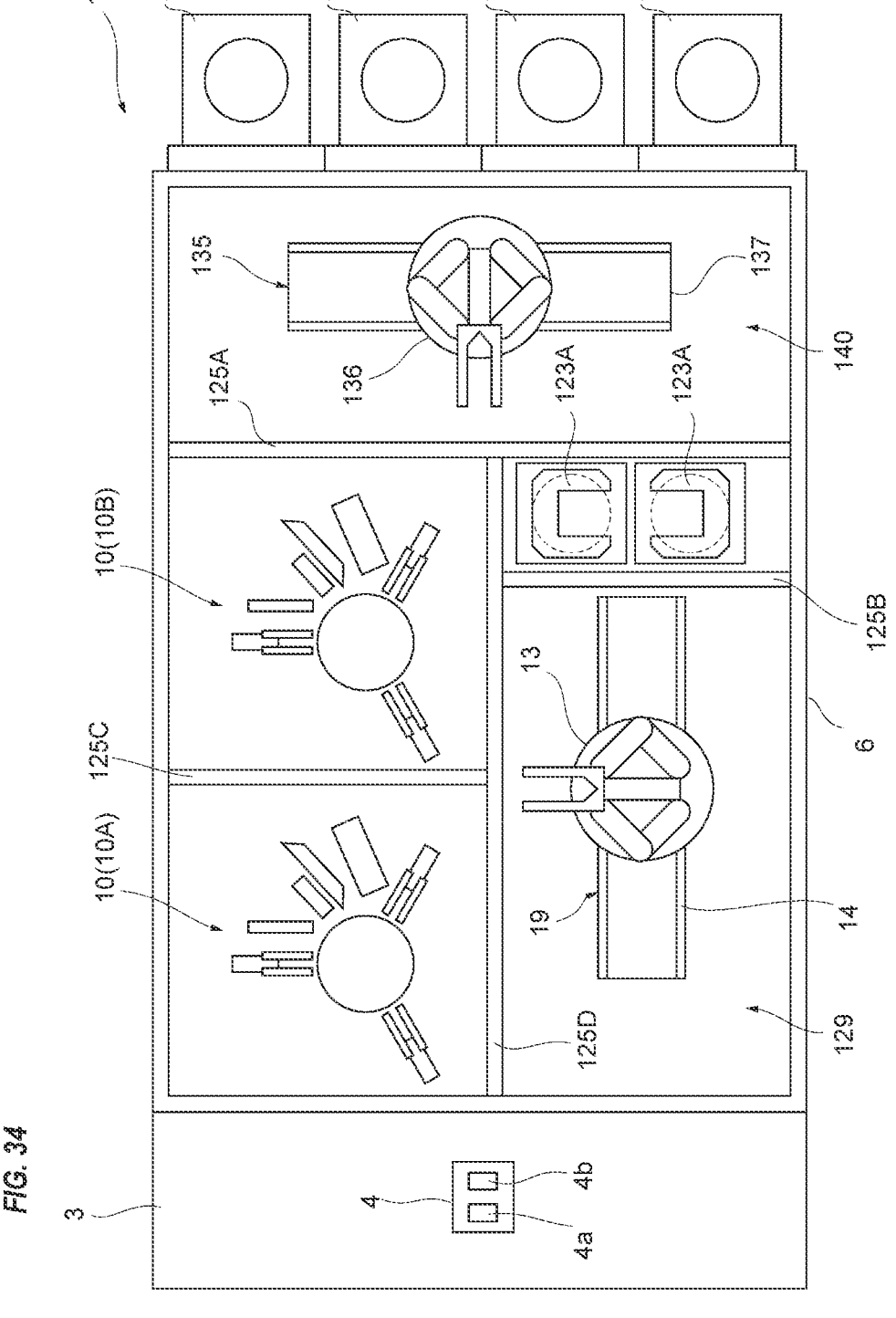
FIG. 34 is a plan view schematically showing the tape sticking system according to another embodiment.
Figure 35:
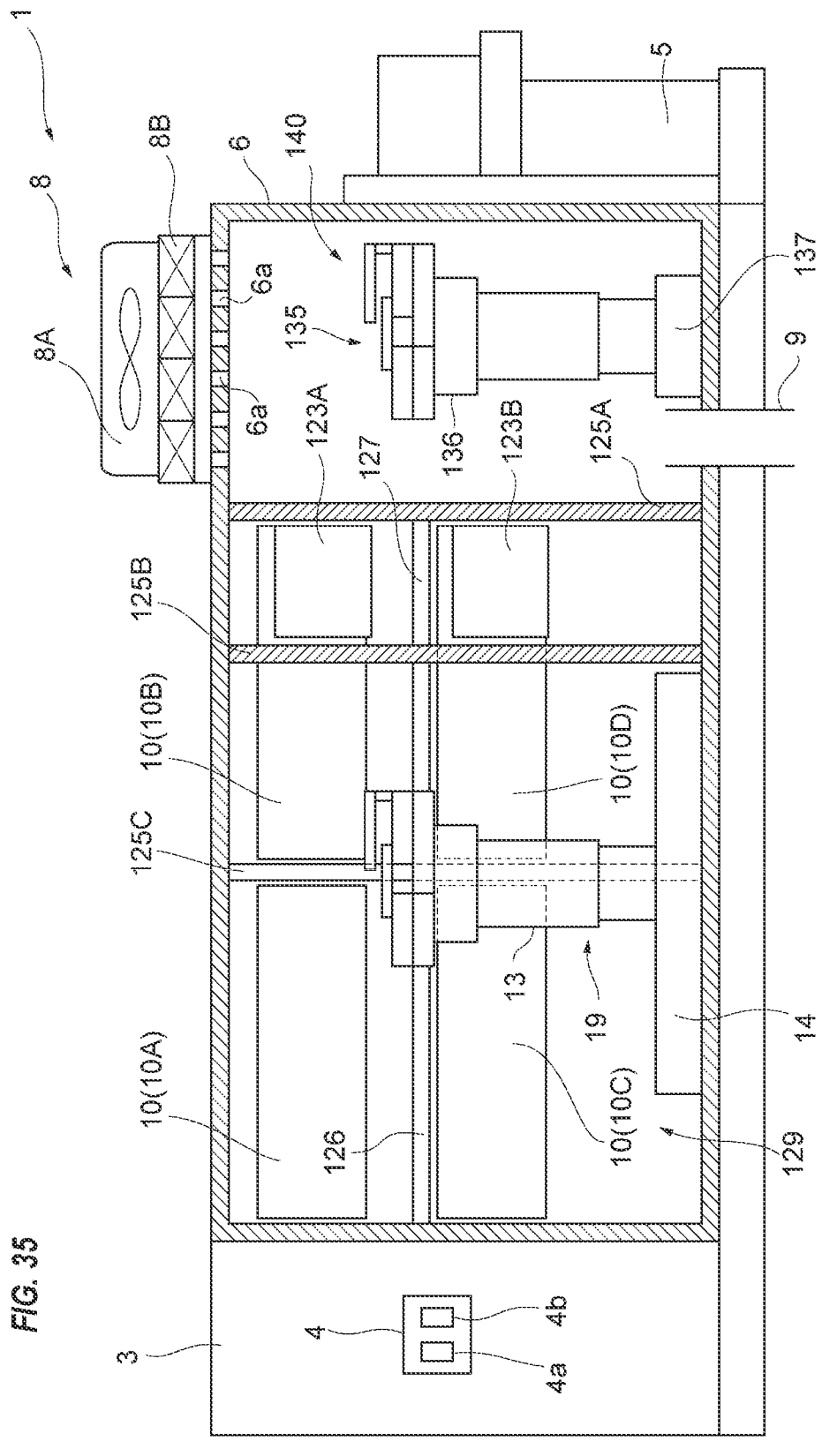
FIG. 35 is a side view schematically showing the tape sticking system shown in FIG. 34.

FIG. 34 is a plan view schematically showing the tape sticking system 1 according to another embodiment, FIG. 35 is a side view schematically showing the tape sticking system 1 shown in FIG. 34. Details of this embodiment, which will not be particularly described, are the same as those of the embodiments described with reference to FIGS. 28 through 31, and thus duplicate descriptions thereof will be omitted. As shown in FIGS. 34 and 35, the tape sticking system 1 according to this embodiment includes the plurality of tape sticking apparatuses 10 arranged side by side vertically and laterally (in the vertical direction and in the horizontal direction). The tape sticking system 1 according to this embodiment is not equipped with the tape peeling apparatus 80. Hereinafter, in this specification, each tape sticking apparatus 10 may be referred to as a tape sticking apparatus 10A, a tape sticking apparatus 10B, a tape sticking apparatus 10C, or a tape sticking apparatus 10D. The configuration of each of the tape sticking apparatuses 10A, 10B, 10C, and 10D is the same configuration as the tape sticking apparatus 10.

The tape sticking apparatuses 10C, 10D are arranged below the tape sticking apparatuses 10A, 10B, respectively. The tape sticking apparatuses 10A, 10B are arranged side by side in the horizontal direction, and the tape sticking apparatuses 10C, 10D are arranged side by side in the horizontal direction.

The dividing wall 125C is arranged between the tape sticking apparatus 10A and the tape sticking apparatus 10B, and between the tape sticking apparatus 10C and the tape sticking apparatus 10D. The dividing wall 126 is arranged between the tape sticking apparatus 10A and the tape sticking apparatus 10C, and between the tape sticking apparatus 10B and the tape sticking apparatus 10D. In one embodiment, the tape sticking system 1 may include one or more tape peeling devices 80 arranged below the tape sticking apparatuses 10C, 10D, and may include a dividing wall extending horizontally and disposed between the tape sticking apparatuses 10C, 10D and the tape peeling devices 80. Further, in one embodiment, the plurality of tape peeling apparatuses 80 arranged below the tape sticking apparatuses 10C, 10D are arranged side by side in the same direction as the tape sticking apparatuses 10C, 10D (in the second direction). The configuration of the embodiments described with reference to FIGS. 30 and 31 can be applied to this embodiment as well.

Figure 36:
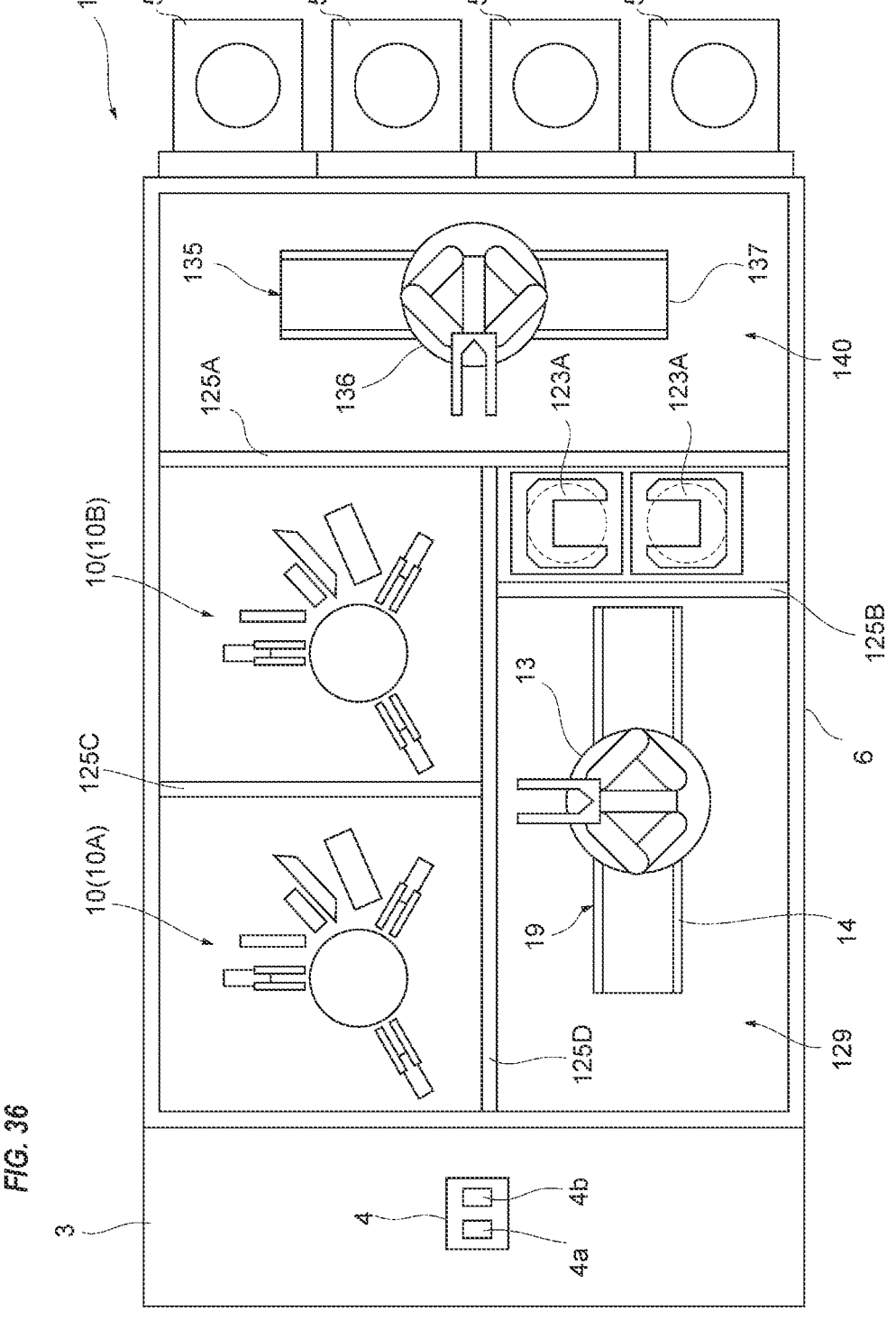
FIG. 36 is a plan view schematically showing the tape sticking system according to another embodiment.
Figure 37:
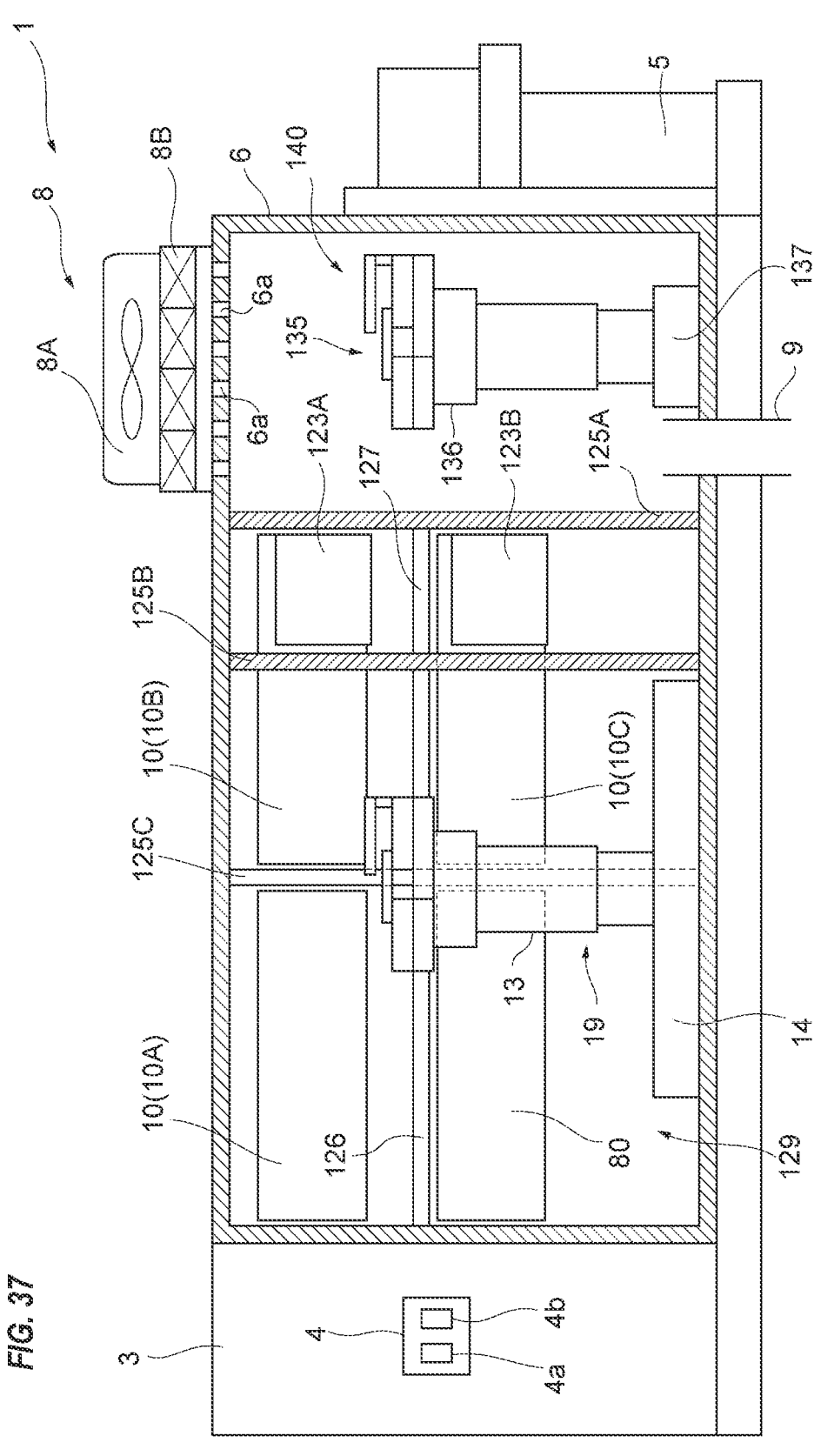
FIG. 37 is a side view schematically showing the tape sticking system shown in FIG. 36.

FIG. 36 is a plan view schematically showing the tape sticking system 1 according to another embodiment, and FIG. 37 is a side view schematically showing the tape sticking system 1 shown in FIG. 36. Details of this embodiment, which will not be particularly described, are the same as those of the embodiments described with reference to FIGS. 28 through 31, and thus duplicate descriptions thereof will be omitted. As shown in FIGS. 36 and 37, the tape sticking system 1 according to this embodiment includes three tape sticking apparatuses 10A, 10B, 10C, and one tape peeling apparatus 80.

The tape sticking apparatus 10A and the tape sticking apparatus 10B are arranged side by side in the horizontal direction, and the tape peeling apparatus 80 and the tape sticking apparatus 10C are arranged side by side in the horizontal direction. The tape sticking apparatus 10C is arranged below the tape sticking apparatus 10B, and the tape peeling apparatus 80 is arranged below the tape sticking apparatus 10A.

The dividing wall 125C is arranged between the tape sticking apparatus 10A and the tape sticking apparatus 10B, and between tape sticking apparatus 10C and the tape peeling apparatus 80. The dividing wall 126 is arranged between the tape sticking apparatus 10B and the tape sticking apparatus 10C, and between the tape sticking apparatus 10A and the tape peeling apparatus 80. The configuration of the embodiments described with reference to FIGS. 30 and 31 can be applied to this embodiment as well.

The tape sticking systems 1 described with reference to FIGS. 28 through 37 include the processing apparatuses 10, 80, which are arranged side by side in the vertical direction and in the horizontal direction, and thus the tape sticking process and the tape peeling process can be performed on multiple wafers at the same time. As a result, throughput of the tape sticking system 1 can be increased. Further, the transfer robot 13 is arranged in the center of the process area 129, and is configured to be accessible to each of the processing apparatuses. Such arrangement enables the transfer robot 13 to efficiently supply and retrieve the wafers to each of the tape sticking apparatuses 10 and each of the tape peeling apparatuses 80.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention can be used in a tape sticking system and a tape sticking method of sticking a protective tape for protecting a peripheral portion of a substrate, such as a wafer. The present invention can also be used in a tape peeling system and a tape peeling method of peeling a protective tape stuck on a peripheral portion of a substrate, such as a wafer.

REFERENCE SIGNS LIST

1 tape sticking system
3 power controller
4 operation controller
5 load port
6 partition wall
7 processing chamber
8 ventilating device
9 local exhaust ventilation
10 tape sticking apparatus
13 transfer robot
14 linear guide
15 tape heating apparatus
15a heating stage
16 Bernoulli hand
17 base
18 chuck
18a suction surface
19 transfer device
20 tape sticking module

21 substrate holder for sticking
22 substrate stage
23 shaft
24 notch detector
25 shaft support
26 centering mechanism
27 protective tape
28 tape sticking unit
29 separation film
30 feeding roller
31 tension unit
32 centering finger
33 projecting portion (finger portion)
34 guide roller
35 film take-up roller
36, 37 rotational shaft
38 protective film
39 vacuum line
40 tape holding head
41 electric cylinder
42 positioning roller
43 side roller
44 support
45 air cylinder
46 first roller
47 second roller
48 rotating device
49 roller-driving motor
50 tape cutter
52 projecting end portion
54 third roller
55 fourth roller
56 moving device
57, 58 bearing
60 nipping mechanism
61, 62 movement mechanism
63, 64 bridge
66 spring
70 tape peeling system
71 power controller
73 transfer robot
74 operation controller
75 load port
76 partition wall
77 processing chamber
78 ventilating device
79 local exhaust ventilation
80 tape peeling apparatus
81 tape peeling module
82 Bernoulli hand
83 substrate holder for peeling
84 centering mechanism
85 UV irradiation module
86 substrate stage
87 shaft
88 stage motor
89 notch detector
90 tape peeling unit
91 chucking member
92 centering finger
93 chucking mechanism
94 projecting portion (finger portion)
95 tape advancing roller
96 take-up roller
97, 99 motor
100 tape processing system
101 substrate holder for UV irradiation

102 substrate stage
103 shaft
104 substrate holding device
105 stage motor
106 base
107 elevating mechanism
108a guide rod
108b linear guide
109 moving mechanism
110 UV irradiation unit
111 light-shielding cover
111a through-hole
112 inner space
113 irradiation head
114 fiber cable
115 UV generator
116 centering mechanism
117 centering finger
118 projecting portion (finger portion)
120 upper wall
121 disposal box
123A, 123B temporary stage
125A, 125B, 125C, 125D, 126, 127 dividing wall
128 disposal box
129 process area
130, 131 support surface
133 core
135 substrate transfer system
136 transfer robot
137 linear guide
140 EFEM area
142 local exhaust ventilation

The invention claimed is:

1. A tape sticking system, comprising:
a tape sticking apparatus configured to stick a protective tape on a peripheral portion of a substrate,
wherein the tape sticking apparatus includes:
    a substrate holder for sticking configured to rotatably hold the substrate;
    a side roller configured to press the protective tape against a peripheral side surface of the substrate;
    a first roller configured to bend the protective tape along a longitudinal direction thereof, and stick a bent portion of the protective tape onto a first surface of the peripheral portion of the substrate;
    a second roller configured to bend the protective tape along a longitudinal direction thereof, and stick a bent portion of the protective tape onto a second surface of the peripheral portion of the substrate;
    a roller-driving motor coupled to the second roller, and
    a nipping mechanism configured to cause the first roller and the second roller to nip the peripheral portion of the substrate, and
wherein the tape sticking apparatus is configured to cause the second roller to be rotated by use of the roller-driving motor while nipping the peripheral portion of the substrate, held to the substrate holder for sticking, with the first roller and the second roller, to thereby rotate the substrate.

2. The tape sticking system according to claim 1, wherein the second roller is arranged below the first roller.

3. The tape sticking system according to claim 1, wherein the first roller and the second roller have a tapered shape with a gradually decreasing cross-sectional area toward a tip, respectively, and
    the first roller and the second roller are arranged so that the tips are inclined toward a surface of the substrate.

4. The tape sticking system according to claim 1, wherein the first roller and the second roller are made of rubber.

5. The tape sticking system according to claim 1, wherein the tape sticking apparatus further comprises a tape heating apparatus configured to heat the protective tape stuck on the peripheral portion of the substrate.

6. The tape sticking system according to claim 1, further comprising a transfer robot configured to transfer the substrate to the tape sticking apparatus,
    wherein the transfer robot includes a Bernoulli hand configured to hold the substrate using Bernoulli's theorem.

7. The tape sticking system according to claim 1, wherein the tape sticking apparatus comprises a plurality of tape sticking apparatus, and
    the plurality of tape sticking apparatus are arranged side by side in a vertical direction or in a horizontal direction.

8. The tape sticking system according to claim 1, further comprising a tape peeling apparatus configured to peel the protective tape from the peripheral portion of the substrate,
    wherein the tape peeling apparatus includes;
        a substrate holder for peeling configure to hold and rotate the substrate, and
        a UV irradiation module configured to irradiate ultraviolet rays to the protective tape stuck on the peripheral portion of the substrate.

9. The tape sticking system according to claim 8, wherein the tape peeling apparatus is arranged below the tape sticking apparatus.

10. The tape sticking system according to claim 9, wherein the tape peeling apparatus comprises a plurality of tape peeling apparatuses, and
    the plurality of tape peeling apparatuses are arranged side by side horizontally.

11. A tape sticking method of sticking a protective tape on a peripheral portion of a substrate, comprising:
    holding the substrate rotatably by use of a substrate holder for sticking;
    pressing the protective tape against a peripheral side surface of the substrate;
    causing a second roller to be rotated by use of a roller-driving motor coupled to a second motor while nipping the peripheral portion of the substrate with a first roller and the second roller, to thereby rotate the substrate;
    bending the protective tape along a longitudinal direction thereof by use of the first roller, and then sticking a bent portion of the protective tape onto a first surface of the peripheral portion of the substrate; and
    bending the protective tape along the longitudinal direction thereof, and then sticking a bent portion of the protective tape onto a second surface of the peripheral portion of the substrate.

12. The tape sticking method according to claim 11, further comprising: heating the protective tape stuck on the peripheral portion of the substrate.

13. The tape attaching method according to claim 11, further comprising: irradiating ultraviolet rays to the protective tape stuck on the peripheral portion; and
    peeling the protective tape from the peripheral portion of the substrate while rotating the substrate.

14. A tape peeling system, comprising:
    a tape peeling apparatus configured to peel a protective tape from a peripheral portion of a substrate,
    wherein the tape peeling apparatus includes:
        a substrate holder for peeling configured to hold and rotate the substrate;

a tape peeling unit configured to peel the protective tape from the rotating substrate; and a UV irradiation module configured to irradiate ultraviolet rays to the protective tape stuck on the peripheral portion of the substrate.

15. The tape peeling system according to claim 14, wherein the UV irradiation module further comprises:

a UV irradiation unit configured to irradiate ultraviolet rays a substrate holder for UV irradiation configured to hold the substrate; and a cup-shaped light-shielding cover coupled to the UV irradiation unit, and wherein the light-shielding cover is formed to be able to cover the substrate in its entirety.

16. The tape peeling system according to claim 15, wherein the substrate holder for UV irradiation includes:

a substrate holding device configure to hold and rotate the substrate; and an elevating mechanism configured to move the substrate holding device up and down, and wherein the light-shielding cover is disposed above the substrate holding device, and opens downward.

17. The tape peeling system according to claim 14, further comprising a transfer robot configured to transfer the substrate to the tape peeling apparatus, wherein the transfer robot includes a Bernoulli hand configured to hold the substrate using Bernoulli's theorem.

18. A tape peeling method of peeling off a protective tape from a peripheral portion of a substrate, comprising:

irradiating ultraviolet rays to the protective tape stuck on the peripheral portion; and peeling the protective tape from the peripheral portion of the substrate while rotating the substrate.

19. The tape peeling method according to claim 18, wherein irradiating ultraviolet rays to the protective tape stuck on the peripheral portion comprises irradiating ultraviolet rays to the protective tape stuck on the peripheral portion while covering the substrate in its entirety with the light-shielding cover.

20. The tape peeling method according to claim 19, wherein irradiating ultraviolet rays to the protective tape stuck on the peripheral portion while covering the substrate in its entirety with the light-shielding cover includes irradiating ultraviolet rays to the protective tape while rotating the substrate.

\* \* \* \* \*